(12) United States Patent
Shih et al.

(10) Patent No.: US 10,529,690 B2
(45) Date of Patent: Jan. 7, 2020

(54) PACKAGE STRUCTURES AND METHODS OF FORMING THE SAME

(71) Applicant: Taiwan Semiconductor Manufacturing Company, Ltd., Hsinchu (TW)

(72) Inventors: Ying-Ching Shih, Hsinchu (TW); Chi-Hsi Wu, Hsinchu (TW); Chen-Hua Yu, Hsinchu (TW); Chih-Wei Wu, Zhuangwei Township (TW); Jing-Cheng Lin, Hsinchu (TW); Pu Wang, Hsinchu (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/675,288

(22) Filed: Aug. 11, 2017

(65) Prior Publication Data
US 2018/0138151 A1     May 17, 2018

Related U.S. Application Data

(60) Provisional application No. 62/421,775, filed on Nov. 14, 2016.

(51) Int. Cl.
*H01L 23/12*     (2006.01)
*H01L 25/065*     (2006.01)
(Continued)

(52) U.S. Cl.
CPC ........ *H01L 25/0657* (2013.01); *H01L 23/562* (2013.01); *H01L 24/81* (2013.01); *H01L 24/94* (2013.01); *H01L 24/97* (2013.01); *H01L 25/0655* (2013.01); *H01L 25/074* (2013.01); *H01L 25/117* (2013.01); *H01L 25/50* (2013.01); *H01L 21/561* (2013.01); *H01L 23/3128* (2013.01); *H01L 23/3135* (2013.01);
(Continued)

(58) Field of Classification Search
CPC ........... H01L 2224/97; H01L 2924/181; H01L 2224/81; H01L 2224/83; H01L 25/0655
See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |

(Continued)

FOREIGN PATENT DOCUMENTS

| | | |
|---|---|---|
| KR | 20150053952 A | 5/2015 |
| KR | 20150123420 A | 11/2015 |

(Continued)

*Primary Examiner* — Bradley Smith
*Assistant Examiner* — David J Goodwin
(74) *Attorney, Agent, or Firm* — Slater Matsil, LLP

(57) ABSTRACT

An embodiment is a method including bonding a first die to a first side of an interposer using first electrical connectors, bonding a second die to first side of the interposer using second electrical connectors, attaching a first dummy die to the first side of the interposer adjacent the second die, encapsulating the first die, the second die, and the first dummy die with an encapsulant, and singulating the interposer and the first dummy die to form a package structure.

20 Claims, 26 Drawing Sheets

(51) Int. Cl.
*H01L 23/00* (2006.01)
*H01L 25/07* (2006.01)
*H01L 25/11* (2006.01)
*H01L 25/00* (2006.01)
*H01L 21/56* (2006.01)
*H01L 25/18* (2006.01)
*H01L 23/31* (2006.01)

(52) U.S. Cl.
CPC .............. *H01L 24/13* (2013.01); *H01L 24/14* (2013.01); *H01L 24/16* (2013.01); *H01L 24/17* (2013.01); *H01L 24/32* (2013.01); *H01L 24/73* (2013.01); *H01L 24/92* (2013.01); *H01L 25/18* (2013.01); *H01L 2224/0345* (2013.01); *H01L 2224/0346* (2013.01); *H01L 2224/03452* (2013.01); *H01L 2224/0401* (2013.01); *H01L 2224/0557* (2013.01); *H01L 2224/05572* (2013.01); *H01L 2224/05624* (2013.01); *H01L 2224/05639* (2013.01); *H01L 2224/05647* (2013.01); *H01L 2224/05684* (2013.01); *H01L 2224/06181* (2013.01); *H01L 2224/1145* (2013.01); *H01L 2224/11334* (2013.01); *H01L 2224/11462* (2013.01); *H01L 2224/11464* (2013.01); *H01L 2224/11849* (2013.01); *H01L 2224/13082* (2013.01); *H01L 2224/13109* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/1403* (2013.01); *H01L 2224/14181* (2013.01); *H01L 2224/16145* (2013.01); *H01L 2224/16148* (2013.01); *H01L 2224/16227* (2013.01); *H01L 2224/16238* (2013.01); *H01L 2224/17181* (2013.01); *H01L 2224/32145* (2013.01); *H01L 2224/32225* (2013.01); *H01L 2224/73204* (2013.01); *H01L 2224/81011* (2013.01); *H01L 2224/8181* (2013.01); *H01L 2224/81191* (2013.01); *H01L 2224/81192* (2013.01); *H01L 2224/81815* (2013.01); *H01L 2224/81895* (2013.01); *H01L 2224/92125* (2013.01); *H01L 2224/94* (2013.01); *H01L 2224/97* (2013.01); *H01L 2225/0652* (2013.01); *H01L 2225/06541* (2013.01); *H01L 2924/10253* (2013.01); *H01L 2924/10271* (2013.01); *H01L 2924/10272* (2013.01); *H01L 2924/10329* (2013.01); *H01L 2924/10331* (2013.01); *H01L 2924/10332* (2013.01); *H01L 2924/10333* (2013.01); *H01L 2924/10335* (2013.01); *H01L 2924/1421* (2013.01); *H01L 2924/1431* (2013.01); *H01L 2924/1434* (2013.01); *H01L 2924/1436* (2013.01); *H01L 2924/1437* (2013.01); *H01L 2924/1461* (2013.01); *H01L 2924/14335* (2013.01); *H01L 2924/157* (2013.01); *H01L 2924/15311* (2013.01); *H01L 2924/18161* (2013.01); *H01L 2924/19011* (2013.01); *H01L 2924/19041* (2013.01); *H01L 2924/19042* (2013.01); *H01L 2924/19043* (2013.01); *H01L 2924/19104* (2013.01); *H01L 2924/19105* (2013.01); *H01L 2924/19106* (2013.01); *H01L 2924/3511* (2013.01)

(56) References Cited

U.S. PATENT DOCUMENTS

| | | | |
|---|---|---|---|
| 8,803,316 | B2 | 8/2014 | Lin et al. |
| 8,963,335 | B2 | 2/2015 | Woychik et al. |
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,496,189 | B2 | 3/2016 | Yu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,478,504 | B1 | 10/2016 | Shen et al. |
| 2009/0224401 | A1* | 9/2009 | Fujii ................. H01L 23/16 257/737 |
| 2011/0156229 | A1* | 6/2011 | Shinohara ......... H01L 23/49531 257/676 |
| 2011/0215470 | A1* | 9/2011 | Chen ................. H01L 23/52 257/738 |
| 2013/0075892 | A1 | 3/2013 | Lin et al. |
| 2013/0119552 | A1* | 5/2013 | Lin ................. H01L 25/0652 257/774 |
| 2013/0256875 | A1 | 10/2013 | Chen et al. |
| 2014/0264821 | A1* | 9/2014 | Tang ................ H01L 23/367 257/713 |
| 2015/0187607 | A1* | 7/2015 | Huang ............... H01L 21/565 438/126 |
| 2015/0311182 | A1* | 10/2015 | Lee .................. H01L 23/3737 257/734 |
| 2016/0240391 | A1 | 8/2016 | Chen et al. |
| 2016/0322330 | A1 | 11/2016 | Lin et al. |
| 2016/0358865 | A1* | 12/2016 | Shih ................. H01L 24/02 |
| 2017/0018510 | A1* | 1/2017 | Shen ................ H01L 23/49838 |

FOREIGN PATENT DOCUMENTS

| | | |
|---|---|---|
| TW | 201131715 A | 9/2011 |
| TW | 201314755 A | 4/2013 |
| TW | 201322319 A | 6/2013 |
| TW | 201342559 A | 10/2013 |
| TW | 201526123 A | 7/2015 |
| TW | 201630121 A | 8/2016 |
| TW | 201631737 A | 9/2016 |
| TW | 201639106 A | 11/2016 |

* cited by examiner

PACKAGE STRUCTURES AND METHODS OF FORMING THE SAME

This application claims the benefit of U.S. Provisional Application No. 62/421,775, entitled "PACKAGE STRUCTURES AND METHODS OF FORMING THE SAME," filed on Nov. 14, 2016, which application is hereby incorporated herein by reference.

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. The increased density and corresponding decrease in area of the integrated circuit has generally surpassed the ability to bond an integrated circuit chip directly onto a substrate. Interposers have been used to redistribute ball contact areas from that of the chip to a larger area of the interposer. Further, interposers have allowed for a three-dimensional (3D) package that includes multiple chips. Other packages have also been developed to incorporate 3D aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
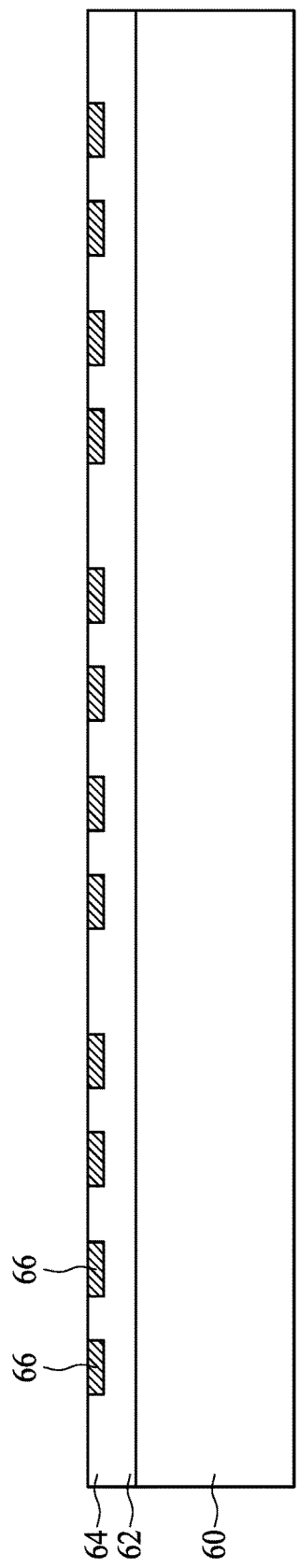
FIGS. 1 through 14 are cross-sectional views and plan views in an example process of forming a package structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure including dummy die structures adjacent the active dies to reduce the warpage of the package structure. This reduction of the warpage of the package structure enables a more reliable package structure by reducing the likelihood of cold joints between the active dies and the interposer. In some embodiments, the dummy dies are along the periphery of the package structure, such as in or near the scribe line regions.

Embodiments will be described with respect to a specific context, namely a Die-Interposer-Substrate stacked package using Chip-on-Wafer-on-Substrate (CoWoS) processing. Other embodiments may also be applied, however, to other packages, such as a Die-Die-Substrate stacked package, and other processing. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

FIG. 1 illustrates the formation of one or more die 68. A main body 60 of the dies 68 may comprise any number of dies, substrates, transistors, active devices, passive devices, or the like. In an embodiment, the main body 60 may include a bulk semiconductor substrate, semiconductor-on-insulator (SOI) substrate, multi-layered semiconductor substrate, or the like. The semiconductor material of the main body 60 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The main body 60 may be doped or undoped. Devices, such as transistors, capacitors, resistors, diodes, and the like, may be formed in and/or on an active surface 62.

An interconnect structure 64 comprising one or more dielectric layer(s) and respective metallization pattern(s) is formed on the active surface 62. The metallization pattern(s) in the dielectric layer(s) may route electrical signals between the devices, such as by using vias and/or traces, and may also contain various electrical devices, such as capacitors, resistors, inductors, or the like. The various devices and metallization patterns may be interconnected to perform one or more functions. The functions may include memory structures, processing structures, sensors, amplifiers, power distribution, input/output circuitry, or the like. Additionally, die connectors 66, such as conductive pillars (for example, comprising a metal such as copper), are formed in and/or on the interconnect structure 64 to provide an external electrical connection to the circuitry and devices. In some embodiments, the die connectors 66 protrude from the interconnect structure 64 to form pillar structure to be utilized when bonding the dies 68 to other structures. One of ordinary skill in the art will appreciate that the above examples are provided for illustrative purposes. Other circuitry may be used as appropriate for a given application.

More particularly, an inter-metallization dielectric (IMD) layer may be formed in the interconnect structure 64. The IMD layer may be formed, for example, of a low-K dielectric material, such as phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), plasma-enhanced CVD (PECVD), high-density plasma chemical vapor deposition (HDP-CVD), or the like. A metallization pattern may be formed in the IMD layer, for example, by using photolithography techniques to deposit and pattern a photoresist material on the IMD layer to expose portions of the IMD layer that are to become the metallization pattern. An etch process, such as an anisotropic dry etch process, may be used to create recesses and/or openings in the IMD layer corresponding to the exposed portions of the IMD layer. The recesses and/or openings may be lined with a diffusion barrier layer and filled with a conductive material. The diffusion barrier layer may comprise one or more layers of tantalum nitride, tantalum, titanium nitride, titanium, cobalt tungsten, the like, or a combination thereof, deposited by atomic layer deposition (ALD), or the like. The conductive material of the metallization patterns may comprise copper, aluminum, tungsten, silver, and combinations thereof, or the like, deposited by CVD, physical vapor deposition (PVD), or the like. Any excessive diffusion barrier layer and/or conductive material on the IMD layer may be removed, such as by using a chemical mechanical polish (CMP).

Figure 2:
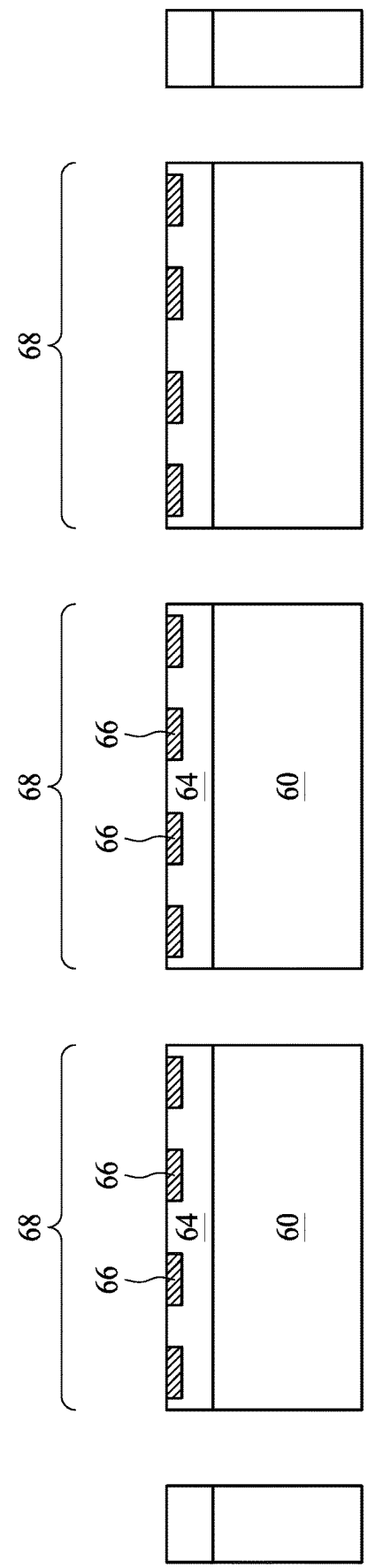

In FIG. 2, the main body 60 including the interconnect structure 64 is singulated into individual dies 68. Typically, the dies 68 contain the same circuitry, such as devices and metallization patterns, although the dies may have different circuitry. The singulation may include sawing, dicing, or the like.

Each of the dies 68 may include one or more logic dies (e.g., central processing unit, graphics processing unit, system-on-a-chip, field-programmable gate array (FPGA), microcontroller, or the like), memory dies (e.g., dynamic random access memory (DRAM) die, static random access memory (SRAM) die, or the like), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the dies 68 may be different sizes (e.g., different heights and/or surface areas), and in other embodiments, the dies 68 may be the same size (e.g., same heights and/or surface areas).

Figure 3:
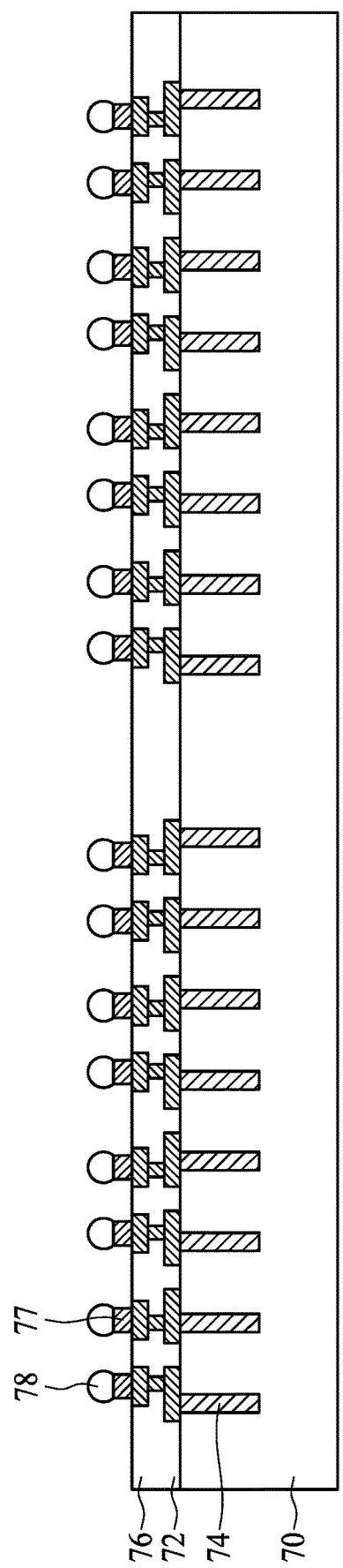
Figure 13:
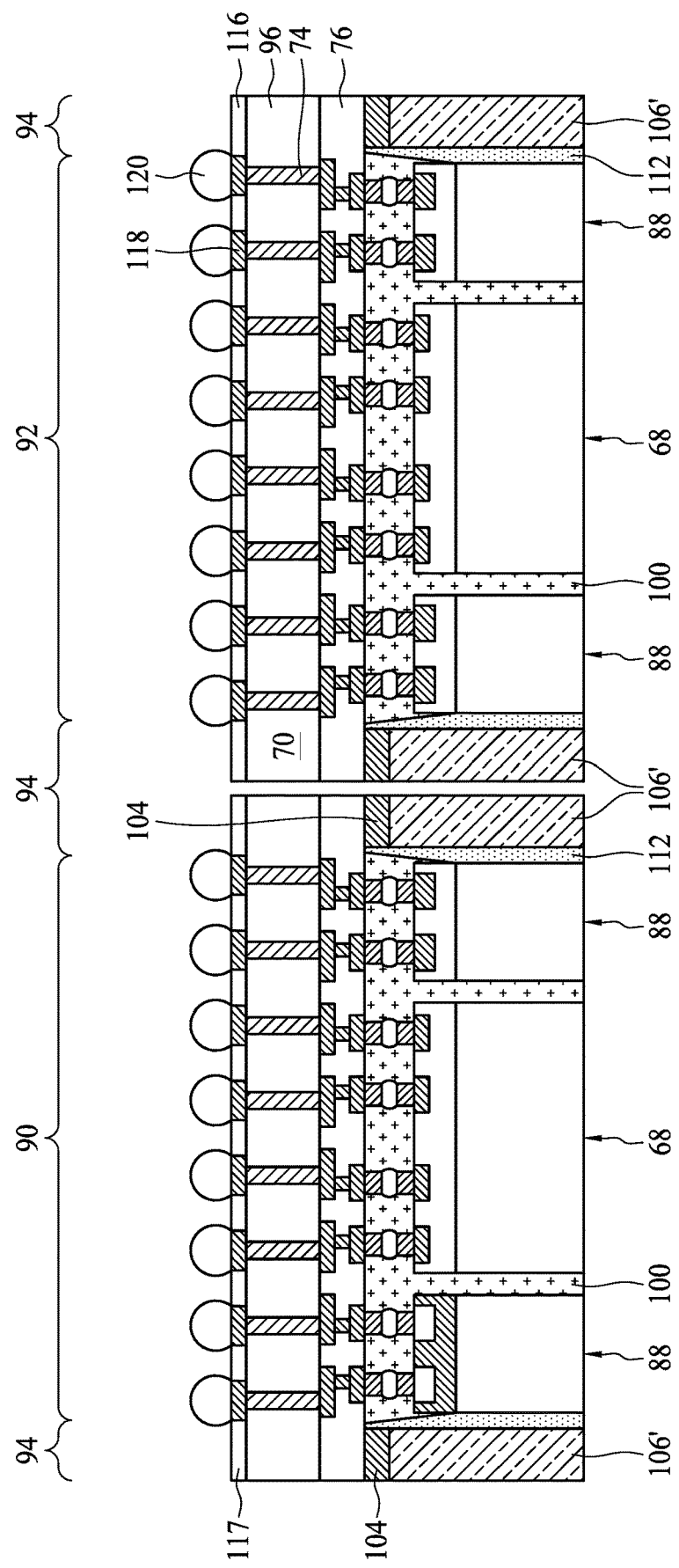

FIG. 3 illustrates the formation of a first side of components 96 (see FIG. 13). A substrate 70 comprises one or more components 96 during processing. The components 96 may be an interposer or another die. The substrate 70 can be a wafer. The substrate 70 may comprise a bulk semiconductor substrate, SOI substrate, multi-layered semiconductor substrate, or the like. The semiconductor material of the substrate 70 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 70 may be doped or undoped. Devices, such as transistors, capacitors, resistors, diodes, and the like, may be formed in and/or on a first surface 72, which may also be referred to as an active surface, of the substrate 70. In embodiments where component 96 is an interposer, component 96 will generally not include active devices therein, although the interposer may include passive devices formed in and/or on a first surface 72.

Through-vias (TVs) 74 are formed to extend from the first surface 72 of substrate 70 into substrate 70. The TVs 74 are also sometimes referred to as through-substrate vias or through-silicon vias when substrate 70 is a silicon substrate. The TVs 74 may be formed by forming recesses in the substrate 70 by, for example, etching, milling, laser techniques, a combination thereof, and/or the like. A thin dielectric material may be formed in the recesses, such as by using an oxidation technique. A thin barrier layer may be conformally deposited over the front side of the substrate 70 and in the openings, such as by CVD, ALD, PVD, thermal oxidation, a combination thereof, and/or the like. The barrier layer may comprise a nitride or an oxynitride, such as titanium nitride, titanium oxynitride, tantalum nitride, tantalum oxynitride, tungsten nitride, a combination thereof, and/or the like. A conductive material may be deposited over the thin barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from the front side of the substrate 70 by, for example, CMP. Thus, the TVs 74 may comprise a conductive material and a thin barrier layer between the conductive material and the substrate 70.

Redistribution structure 76 is formed over the first surface 72 of the substrate 70, and is used to electrically connect the integrated circuit devices, if any, and/or TVs 74 together and/or to external devices. The redistribution structure 76 may include one or more dielectric layer(s) and respective metallization pattern(s) in the dielectric layer(s). The metallization patterns may comprise vias and/or traces to interconnect any devices and/or TVs 74 together and/or to an external device. The metallization patterns are sometimes referred to as Redistribution Lines (RDL). The dielectric layers may comprise silicon oxide, silicon nitride, silicon carbide, silicon oxynitride, low-K dielectric material, such as PSG, BPSG, FSG, $SiO_xC_y$, Spin-On-Glass, Spin-On-Polymers, silicon carbon material, compounds thereof, composites thereof, combinations thereof, or the like. The dielectric layers may be deposited by any suitable method known in the art, such as spinning, CVD, PECVD, HDP-CVD, or the like. A metallization pattern may be formed in the dielectric layer, for example, by using photolithography techniques to deposit and pattern a photoresist material on the dielectric layer to expose portions of the dielectric layer that are to become the metallization pattern. An etch process, such as an anisotropic dry etch process, may be used to create recesses and/or openings in the dielectric layer corresponding to the exposed portions of the dielectric layer.

The recesses and/or openings may be lined with a diffusion barrier layer and filled with a conductive material. The diffusion barrier layer may comprise one or more layers of TaN, Ta, TiN, Ti, CoW, or the like, deposited by ALD, or the like, and the conductive material may comprise copper, aluminum, tungsten, silver, and combinations thereof, or the like, deposited by CVD, PVC, or the like. Any excessive diffusion barrier layer and/or conductive material on the dielectric layer may be removed, such as by using a CMP.

Electrical connectors 77/78 are formed at the top surface of the redistribution structure 76 on conductive pads. In some embodiments, the conductive pads include under bump metallurgies (UBMs). In the illustrated embodiment, the pads are formed in openings of the dielectric layers of the redistribution structure 76. In another embodiment, the pads (UBMs) can extend through an opening of a dielectric layer of the redistribution structure 76 and also extend across the top surface of the redistribution structure 76. As an example to form the pads, a seed layer (not shown) is formed at least in the opening in the dielectric layer of the redistribution structure 76. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads. In the embodiment, where the pads are formed differently, more photo resist and patterning steps may be utilized.

In some embodiments, the electrical connectors 77/78 include a metal pillar 77 with a metal cap layer 78, which may be a solder cap, over the metal pillar 77. The electrical connectors 77/78 including the pillar 77 and the cap layer 78 are sometimes referred to as micro bumps 77/78. In some embodiments, the metal pillars 77 include a conductive material such as copper, aluminum, gold, nickel, palladium, the like, or a combination thereof and may be formed by sputtering, printing, electro plating, electroless plating, CVD, or the like. The metal pillars 77 may be solder free and have substantially vertical sidewalls. In some embodiments, a metal cap layer 78 is formed on the top of the metal pillar 77. The metal cap layer 78 may include nickel, tin, tin-lead, gold, copper, silver, palladium, indium, nickel-palladium-gold, nickel-gold, the like, or a combination thereof and may be formed by a plating process.

In another embodiment, the electrical connectors 77/78 do not include the metal pillars and are solder balls and/or bumps, such as controlled collapse chip connection (C4), electroless nickel immersion Gold (ENIG), electroless nickel electroless palladium immersion gold technique (EN-EPIG) formed bumps, or the like. In this embodiment, the bump electrical connectors 77/78 may include a conductive material such as solder, copper, aluminum, gold, nickel, silver, palladium, tin, the like, or a combination thereof. In this embodiment, the electrical connectors 77/78 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes.

Figure 4:
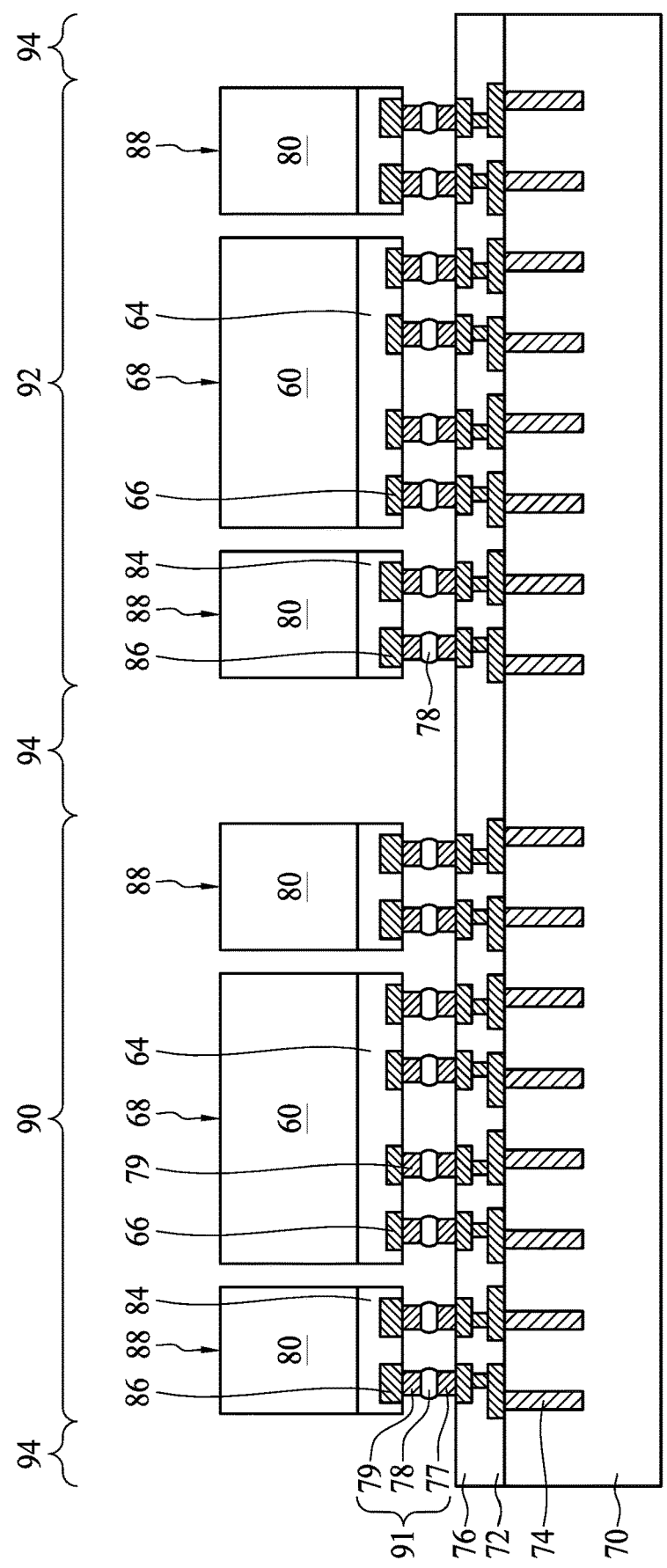

In FIG. 4, the dies 68 and the dies 88 are attached to the first side of the components 96, for example, through flip-chip bonding by way of the electrical connectors 77/78 and the metal pillars 79 on the dies to form conductive joints 91. The metal pillars 79 may be similar to the metal pillars 77 and the description is not repeated herein. The dies 68 and the dies 88 may be placed on the electrical connectors 77/78 using, for example, a pick-and-place tool. In some embodiments, the metal cap layers 78 are formed on the metal pillars 77 (as shown in FIG. 3), the metal pillars 79 of the dies 68 and the dies 88, or both.

The dies 88 may be formed through similar processing as described above in reference to the dies 68. In some embodiments, the dies 88 include one or more memory dies, such as a stack of memory dies (e.g., DRAM dies, SRAM dies, High-Bandwidth Memory (HBM) dies, Hybrid Memory Cubes (HMC) dies, or the like). In the stack of memory dies embodiments, a die 88 can include both memory dies and a memory controller, such as, for example, a stack of four or eight memory dies with a memory controller. Also, in some embodiments, the dies 88 may be different sizes (e.g., different heights and/or surface areas), and in other embodiments, the dies 88 may be the same size (e.g., same heights and/or surface areas).

In some embodiments, the dies 88 may be similar heights to those of the dies 68 (as shown in FIG. 4) or in some embodiments, the dies 68 and 88 may be of different heights.

The dies 88 include a main body 80, an interconnect structure 84, and die connectors 86. The main body 80 of the dies 88 may comprise any number of dies, substrates, transistors, active devices, passive devices, or the like. In an embodiment, the main body 80 may include a bulk semiconductor substrate, semiconductor-on-insulator (SOI) substrate, multi-layered semiconductor substrate, or the like. The semiconductor material of the main body 80 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The main body 80 may be doped or undoped. Devices, such as transistors, capacitors, resistors, diodes, and the like, may be formed in and/or on an active surface.

An interconnect structure 84 comprising one or more dielectric layer(s) and respective metallization pattern(s) is formed on the active surface. The metallization pattern(s) in the dielectric layer(s) may route electrical signals between the devices, such as by using vias and/or traces, and may also contain various electrical devices, such as capacitors, resistors, inductors, or the like. The various devices and metallization patterns may be interconnected to perform one or more functions. The functions may include memory structures, processing structures, sensors, amplifiers, power distribution, input/output circuitry, or the like. Additionally, die connectors 86, such as conductive pillars (for example, comprising a metal such as copper), are formed in and/or on the interconnect structure 84 to provide an external electrical connection to the circuitry and devices. In some embodiments, the die connectors 86 protrude from the interconnect structure 84 to form pillar structure to be utilized when bonding the dies 88 to other structures. One of ordinary skill in the art will appreciate that the above examples are provided for illustrative purposes. Other circuitry may be used as appropriate for a given application.

More particularly, an IMD layer may be formed in the interconnect structure 84. The IMD layer may be formed, for example, of a low-K dielectric material, such as PSG, BPSG, FSG, $SiO_xC_y$, Spin-On-Glass, Spin-On-Polymers, silicon carbon material, compounds thereof, composites thereof, combinations thereof, or the like, by any suitable method known in the art, such as spinning, CVD, PECVD, HDP-CVD, or the like. A metallization pattern may be formed in the IMD layer, for example, by using photolithography techniques to deposit and pattern a photoresist material on the IMD layer to expose portions of the IMD layer that are to become the metallization pattern. An etch process, such as an anisotropic dry etch process, may be used to create recesses and/or openings in the IMD layer corresponding to the exposed portions of the IMD layer. The recesses and/or openings may be lined with a diffusion barrier layer and filled with a conductive material. The diffusion barrier layer may comprise one or more layers of tantalum nitride, tantalum, titanium nitride, titanium, cobalt tungsten, the like, or a combination thereof, deposited by ALD, or the like. The conductive material of the metallization patterns may comprise copper, aluminum, tungsten, silver, and combinations thereof, or the like, deposited by CVD, PVD, or the like. Any excessive diffusion barrier layer and/or conductive material on the IMD layer may be removed, such as by using a CMP.

In the embodiments wherein the die connectors 66 and 86 protrude from the interconnect structures 64 and 84, respectively, the metal pillars 79 may be excluded from the dies 68 and 86 as the protruding die connectors 66 and 86 may be used as the pillars for the metal cap layers 78.

The conductive joints 91 electrically couple the circuits in the dies 68 and the dies 88 through interconnect structures 84 and 64 and die connectors 86 and 66, respectively, to redistribution structure 76 and TVs 74 in components 96.

In some embodiments, before bonding the electrical connectors 77/78, the electrical connectors 77/78 are coated with a flux (not shown), such as a no-clean flux. The electrical connectors 77/78 may be dipped in the flux or the flux may be jetted onto the electrical connectors 77/78. In another embodiment, the flux may also be applied to the electrical connectors 79/78. In some embodiments, the electrical connectors 77/78 and/or 79/78 may have an epoxy flux (not shown) formed thereon before they are reflowed with at least some of the epoxy portion of the epoxy flux remaining after the dies 68 and the dies 88 are attached to the components 96. This remaining epoxy portion may act as an underfill to reduce stress and protect the joints resulting from the reflowing the electrical connectors 77/78/79.

The bonding between the dies 68 and 88 and the components 96 may be a solder bonding or a direct metal-to-metal (such as a copper-to-copper or tin-to-tin) bonding. In an embodiment, the dies 68 and the dies 88 are bonded to the components 96 by a reflow process. During this reflow process, the electrical connectors 77/78/79 are in contact with the die connectors 66 and 86, respectively, and the pads of the redistribution structure 76 to physically and electrically couple the dies 68 and the dies 88 to the components 96. After the bonding process, an IMC (not shown) may form at the interface of the metal pillars 77 and 79 and the metal cap layers 78.

In FIG. 4 and subsequent figures, a first package region 90 and a second package region 92 for the formation of a first package and a second package, respectively, are illustrated. Scribe line regions 94 are between adjacent package regions. As illustrated in FIG. 4, a first die and multiple second dies are attached in each of the first package region 90 and the second package region 92.

In some embodiments, the dies 68 are system-on-a-chip (SoC) or a graphics processing unit (GPU) and the second dies are memory dies that may utilized by the dies 68. In an embodiment, the dies 88 are stacked memory dies. For example, the stacked memory dies 88 may include low-power (LP) double data rate (DDR) memory modules, such as LPDDR1, LPDDR2, LPDDR3, LPDDR4, or the like memory modules.

Figure 5:
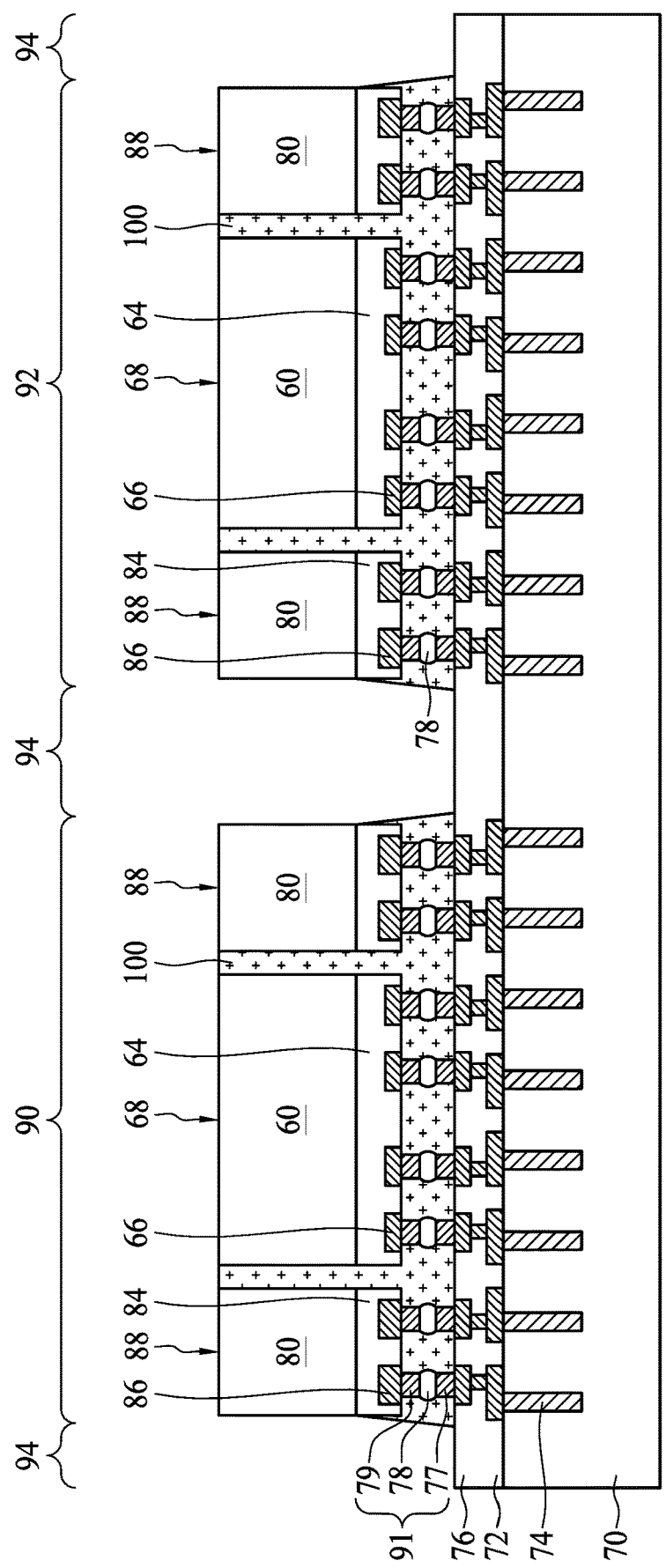

In FIG. 5, an underfill material 100 is dispensed into the gaps between the dies 68, the dies 88, and the redistribution structure 76. The underfill material 100 may extend up along sidewall of the dies 68 and the dies 88. The underfill material 100 may be any acceptable material, such as a polymer, epoxy, molding underfill, or the like. The underfill material 100 may be formed by a capillary flow process after the dies 68 and 88 are attached, or may be formed by a suitable deposition method before the dies 68 and 88 are attached.

FIGS. 6A, 6B, 6C, 6D, 6E, and 6F illustrate plan views of package structures including dummy dies 106 being adhered to the components 96. FIG. 7 is a cross-sectional view illustrating the dummy dies 106 in the package structure. FIG. 7 is along the line A-A of plan view FIG. 6C. The dummy dies 106 can be placed on the components 96 by using, for example, a pick-and-place tool.

Figure 6A:
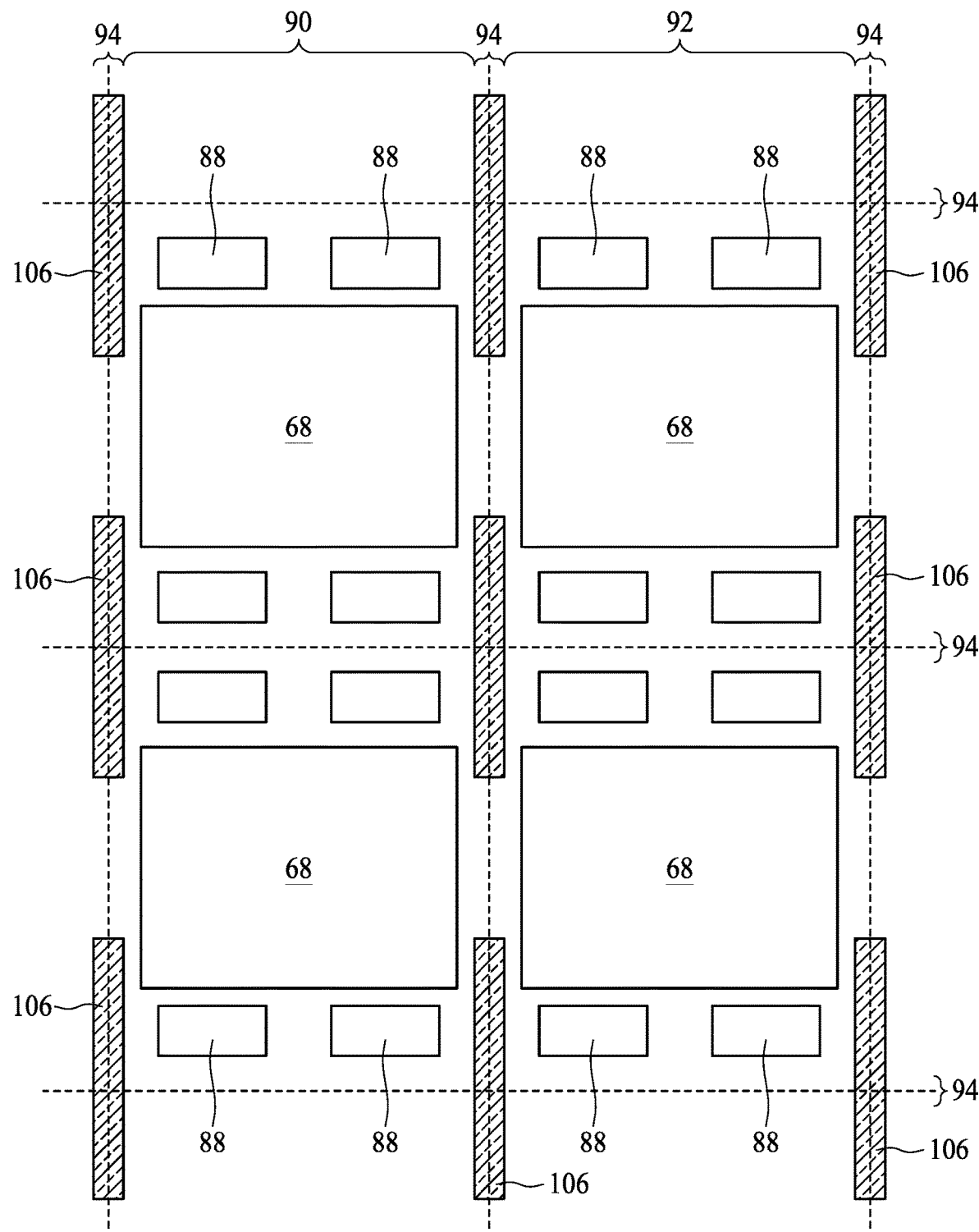
Figure 6B:
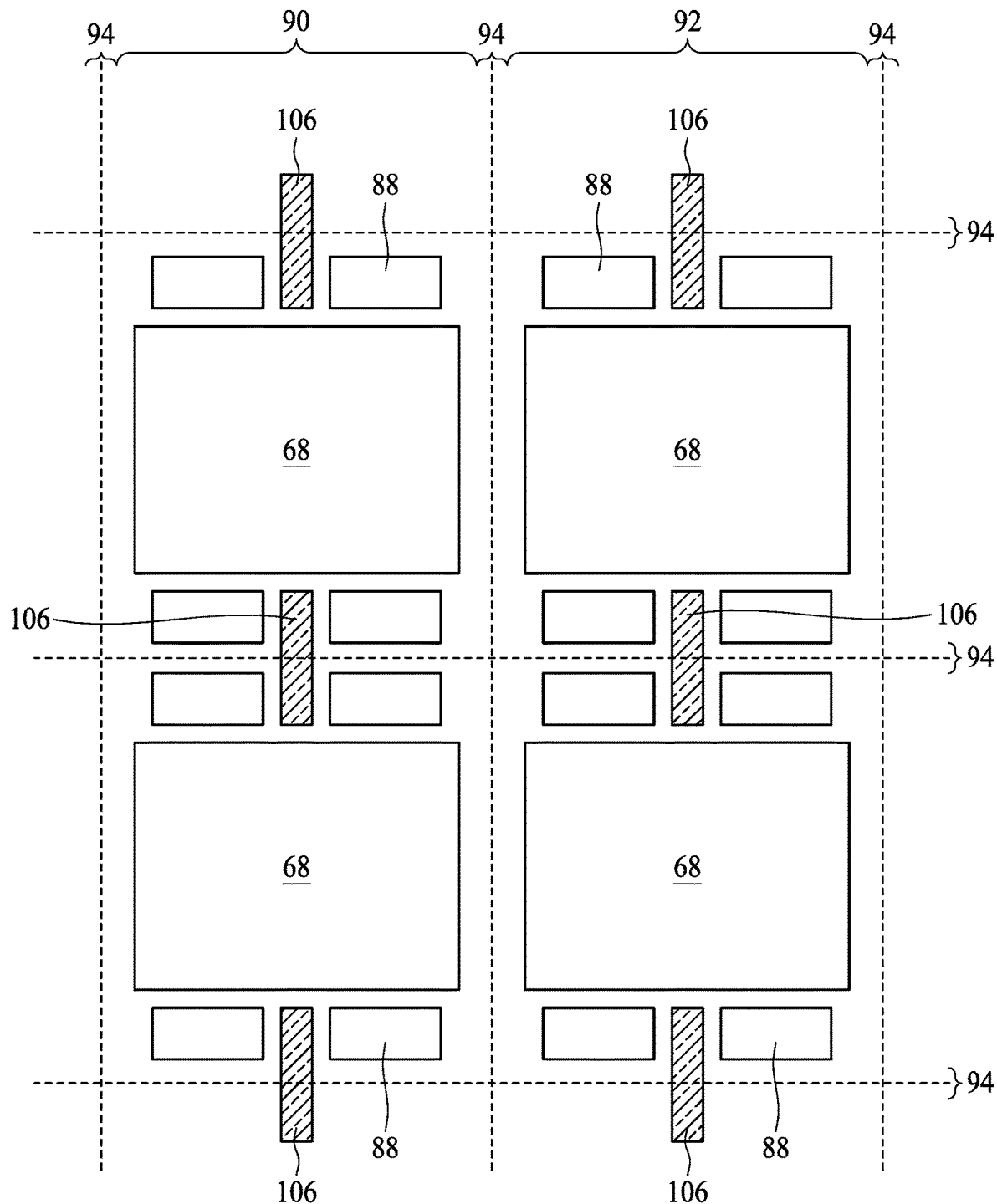
Figure 6C:
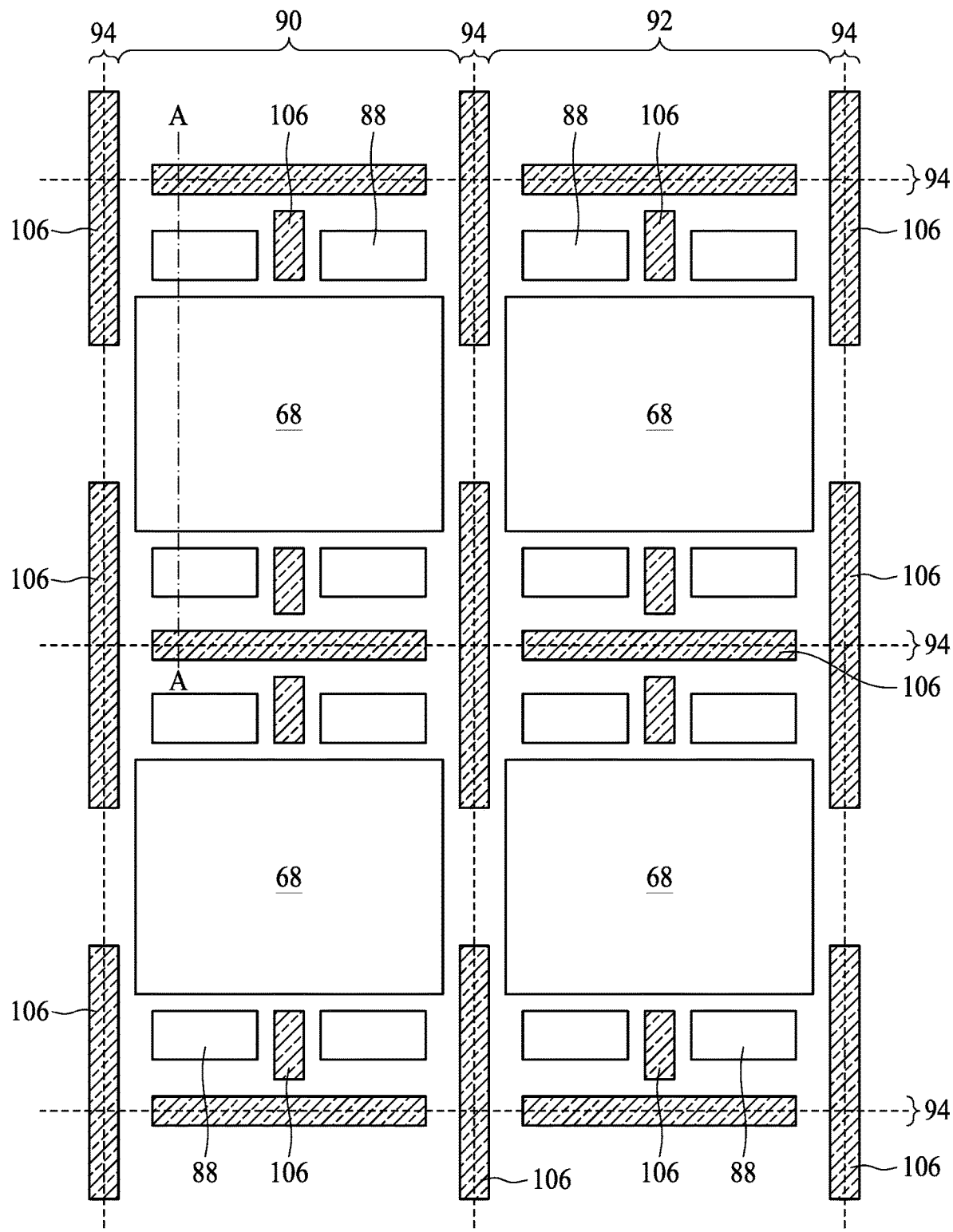
Figure 7:
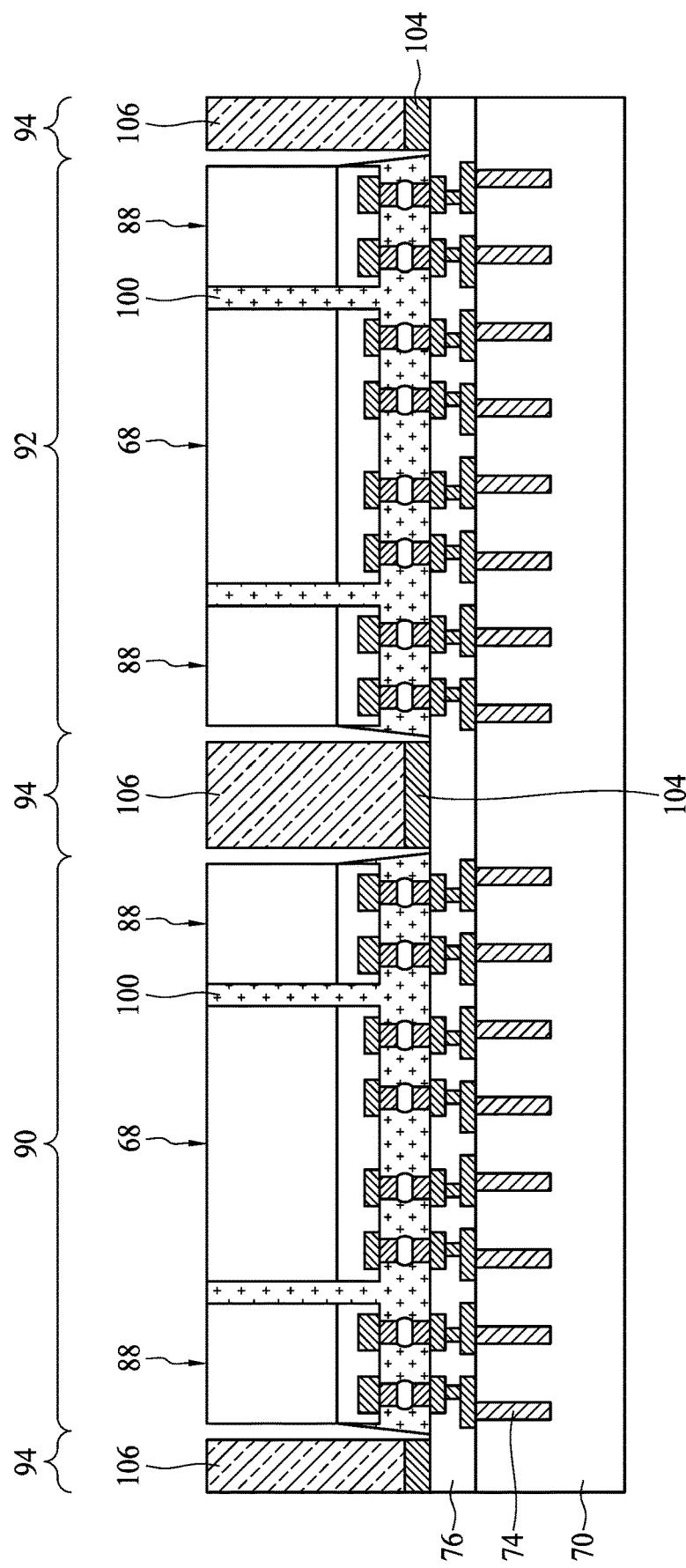

In FIG. 6A, the dummy dies 106 are attached in the scribe line regions 94 and extend along the scribe line regions 94 that are along a first direction (e.g. vertical direction of FIG. 6A). In FIG. 6B, the dummy dies 106 are attached between adjacent dies 88 of the same region 90 and/or 92. In FIG. 6C, the dummy dies 106 are attached in the scribe line regions 94 and extend along the scribe line regions 94 that are along a first direction and second direction (e.g. both vertical and horizontal directions of FIG. 6C) and also interposed between adjacent dies 88 of the same region 90 and/or 92.

Figure 6D:
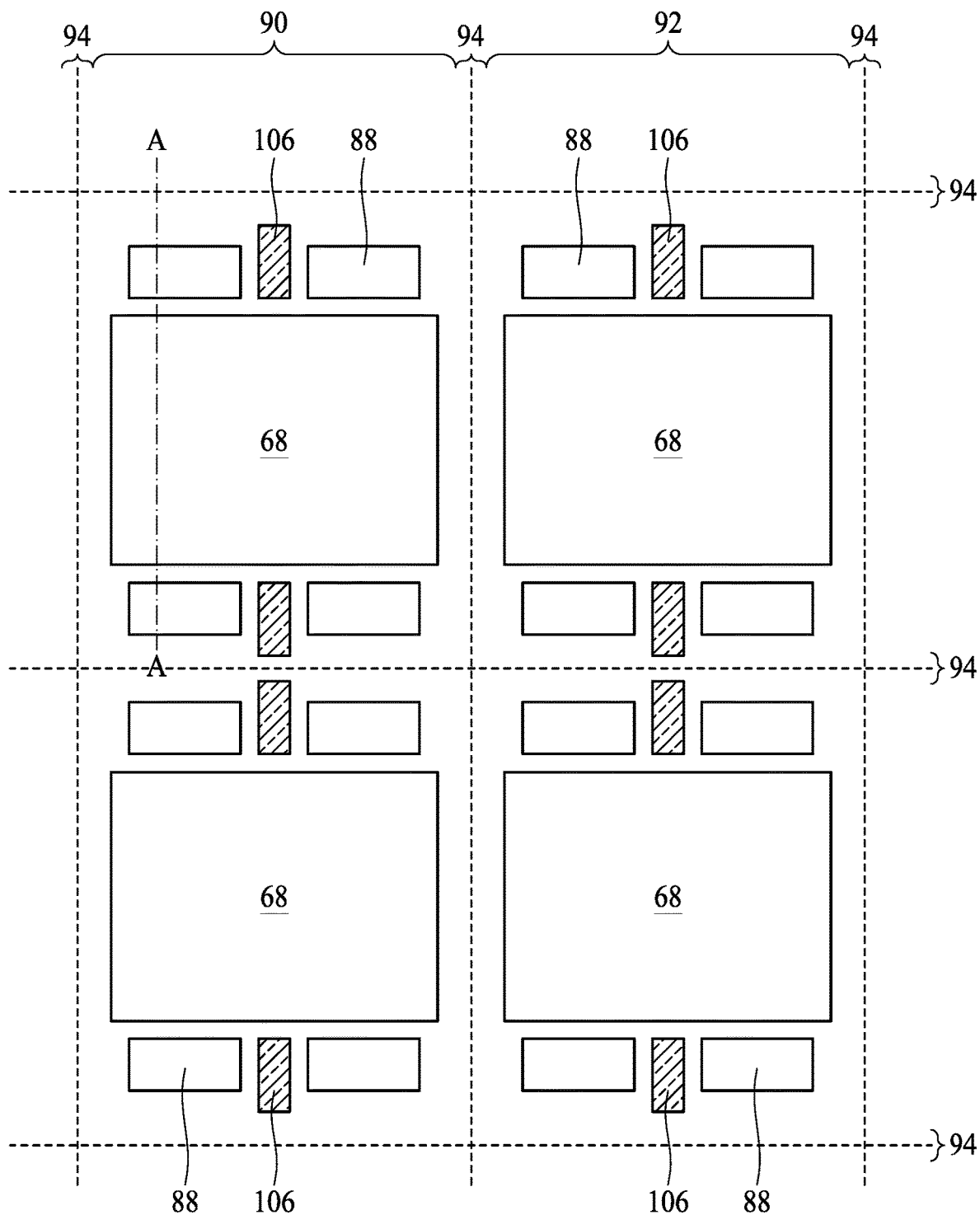
Figure 6E:
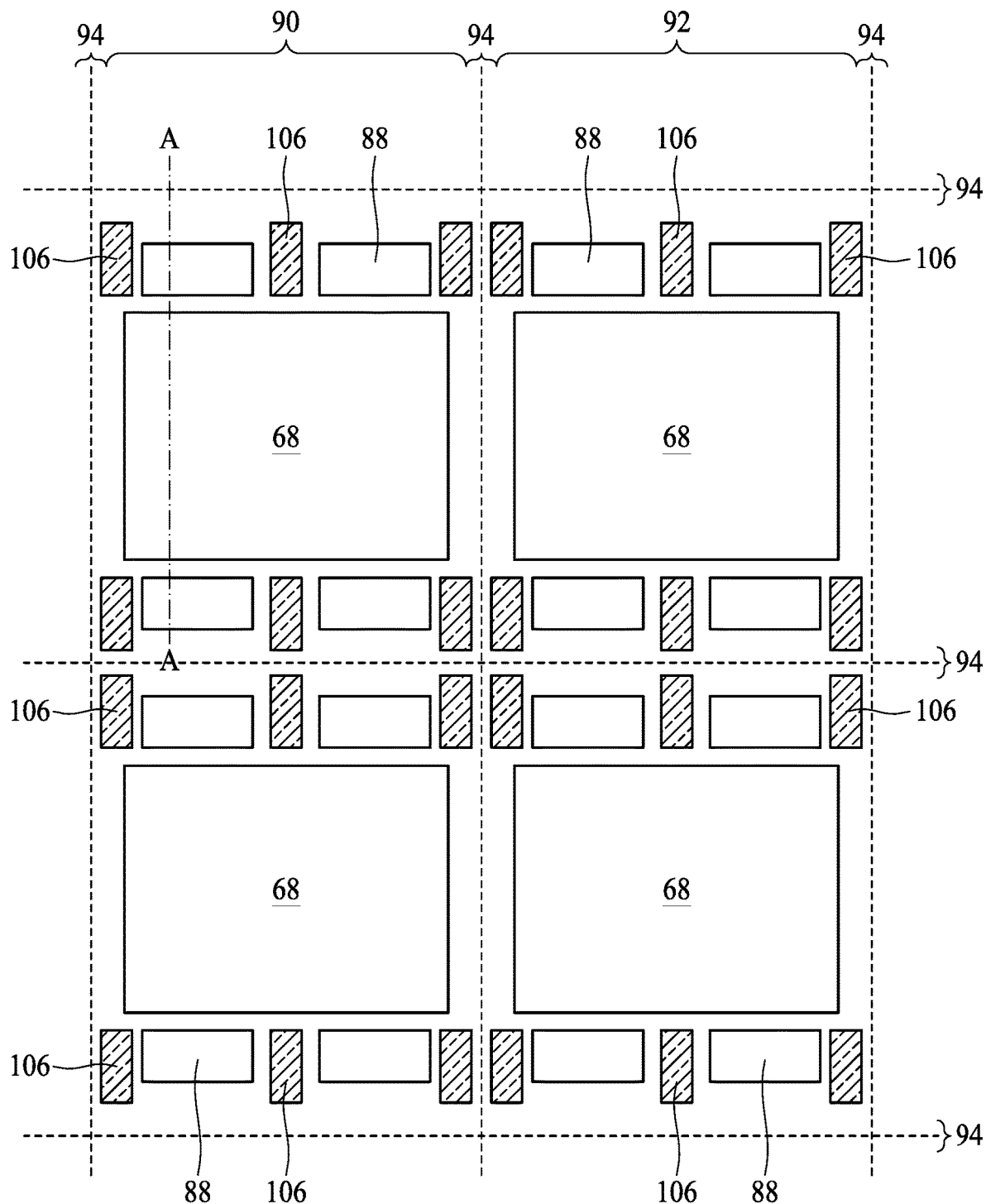
Figure 6F:
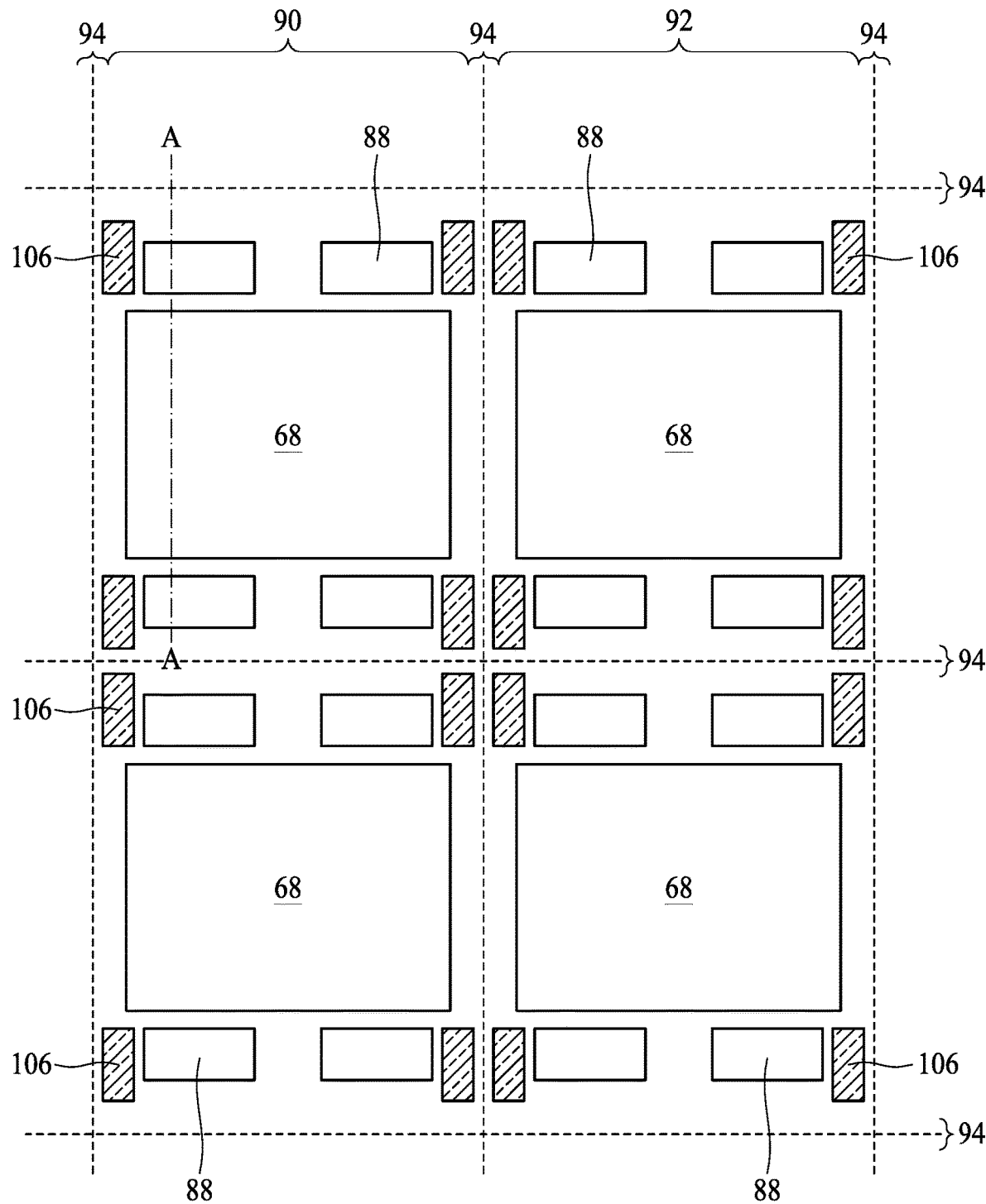

In FIG. 6D, the dummy dies 106 are attached between adjacent dies 88 of the same region 90 and/or 92 and are not in the scribe line regions 94 but are near the scribe line regions 94. In FIG. 6E, the configuration of dummy dies 106 is similar to the configuration of FIG. 6D except that dummy dies 106 are also attached near the corners of the regions 90 and/or 92 adjacent the dies 88. Again, in this embodiment, the dummy dies 106 are not in the scribe line regions 94 but are near the scribe line regions 94. In FIG. 6F, the dummy dies 106 are attached near the corners of the regions 90 and/or 92 adjacent the dies 88 and are not in the scribe line regions 94 but are near the scribe line regions 94.

Figure 15C:
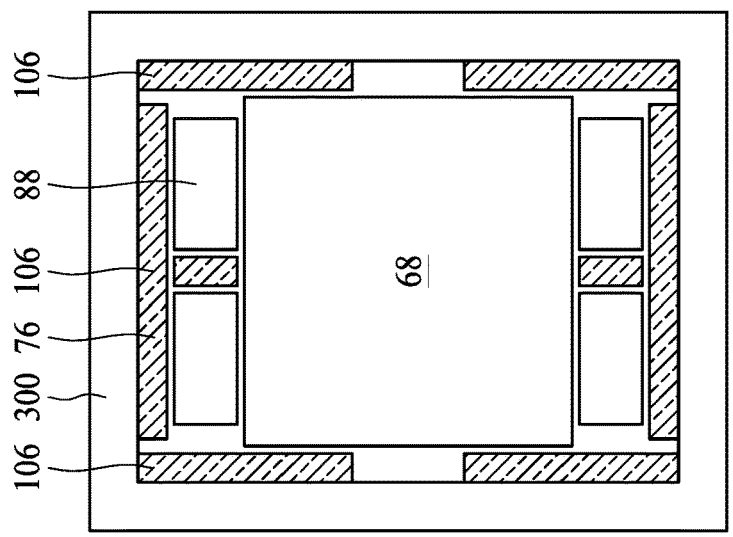
FIGS. 15A-15F illustrate plan views of a package structures in accordance with some embodiments.
Figure 15B:
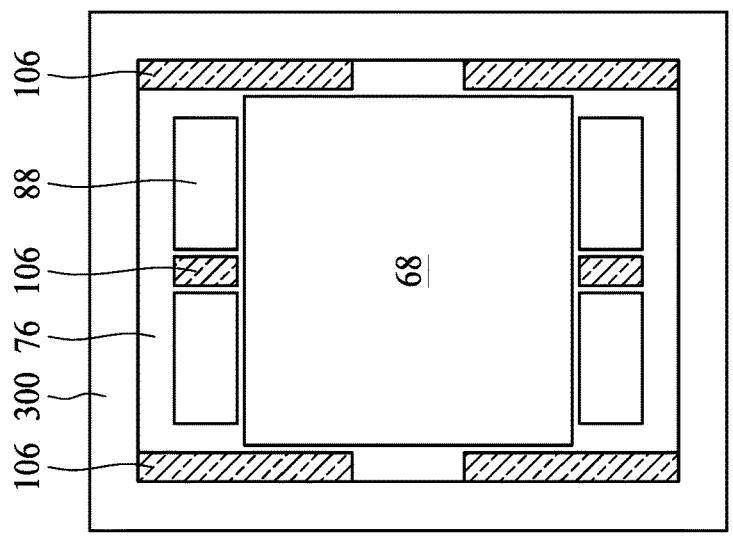
Figure 15A:
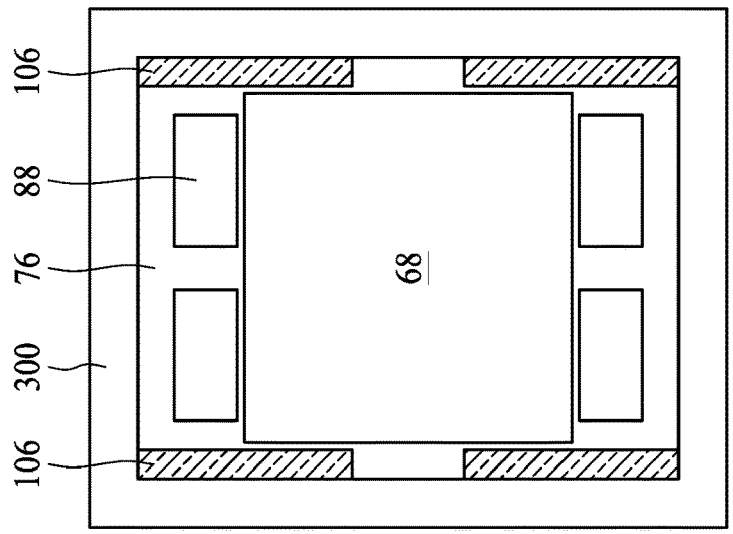
Figure 15F:
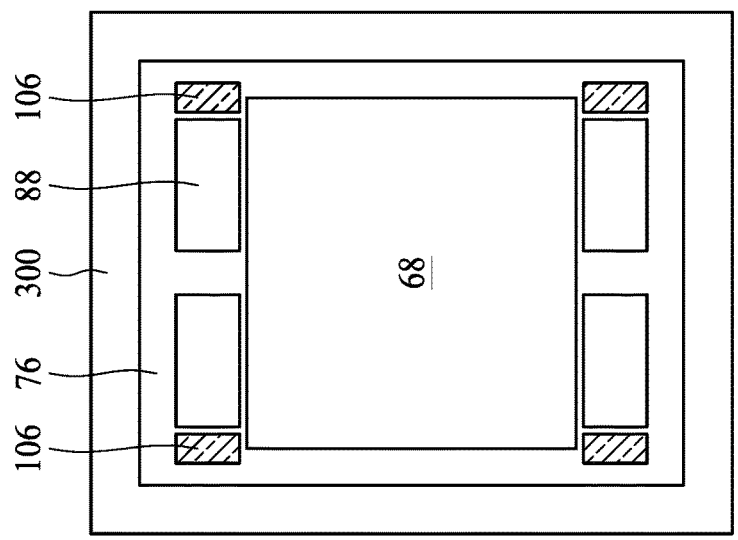
Figure 15E:
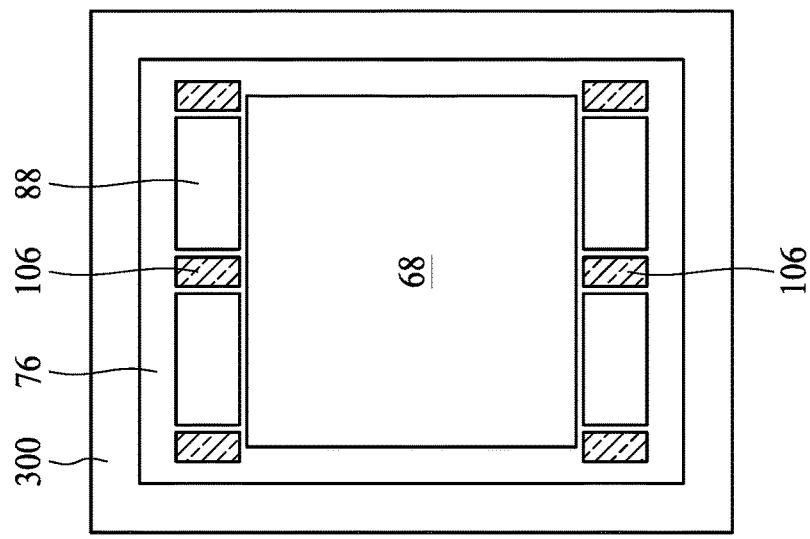
Figure 15D:
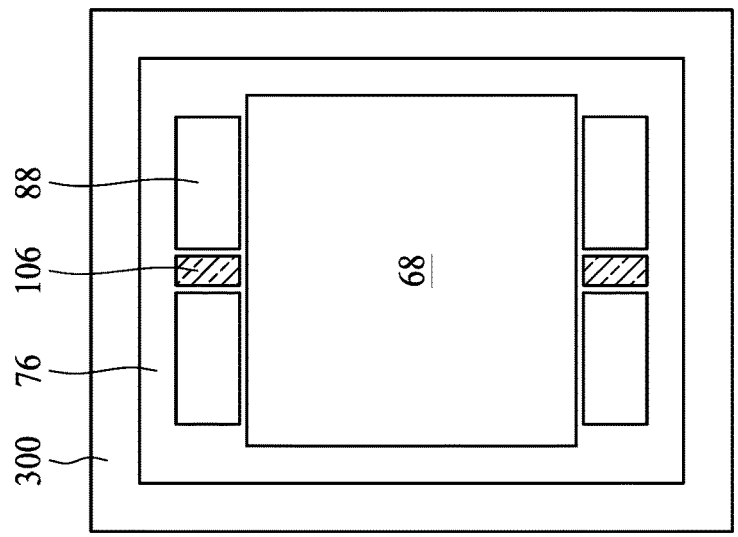
Figure 16C:
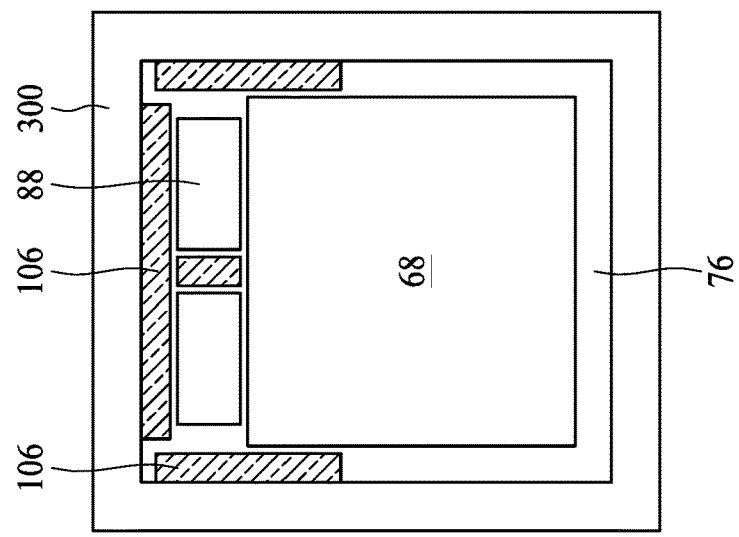
FIGS. 16A-16F illustrate plan views of a package structures in accordance with some embodiments.
Figure 16B:
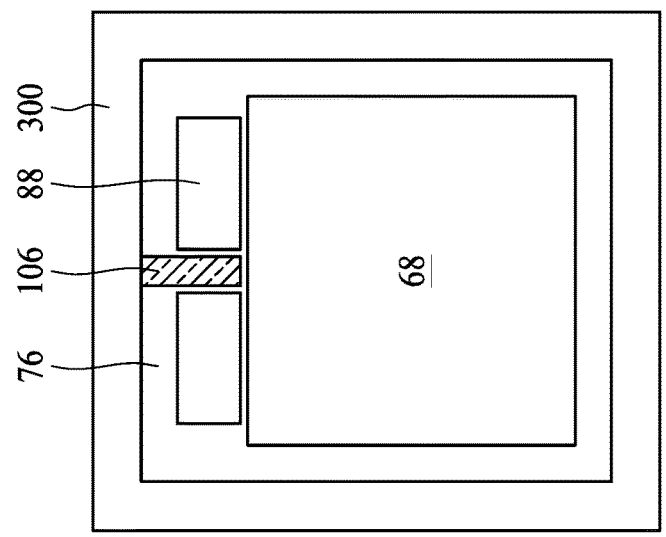
Figure 16A:
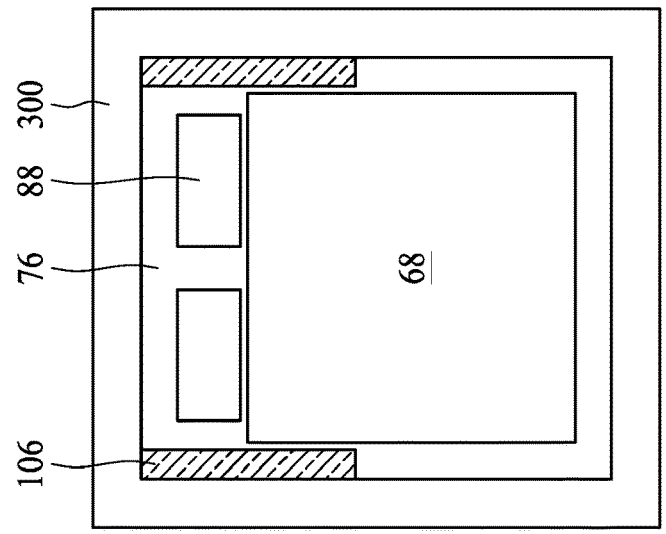
Figure 16F:
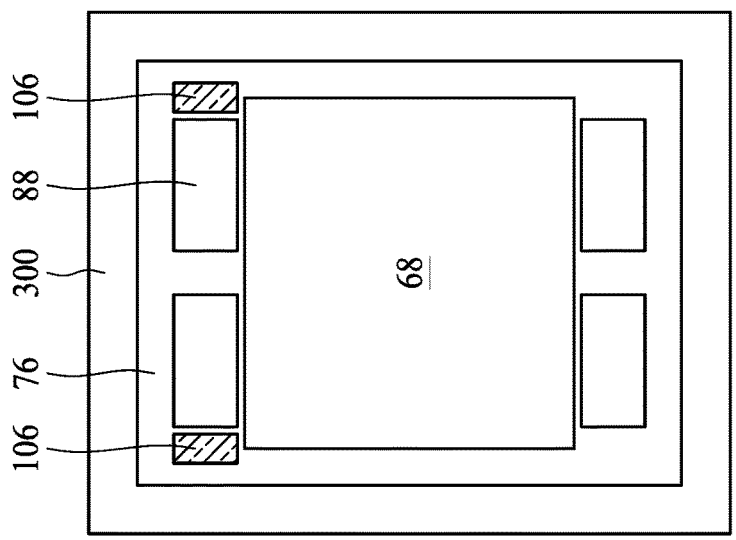
Figure 16E:
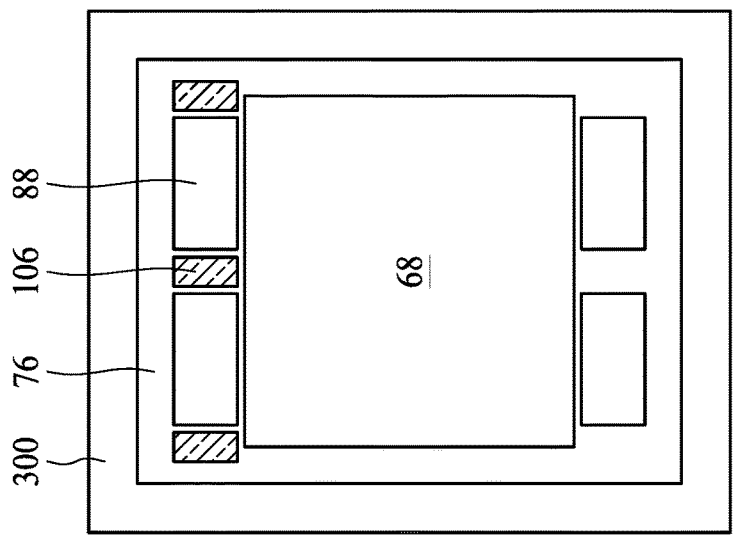
Figure 16D:
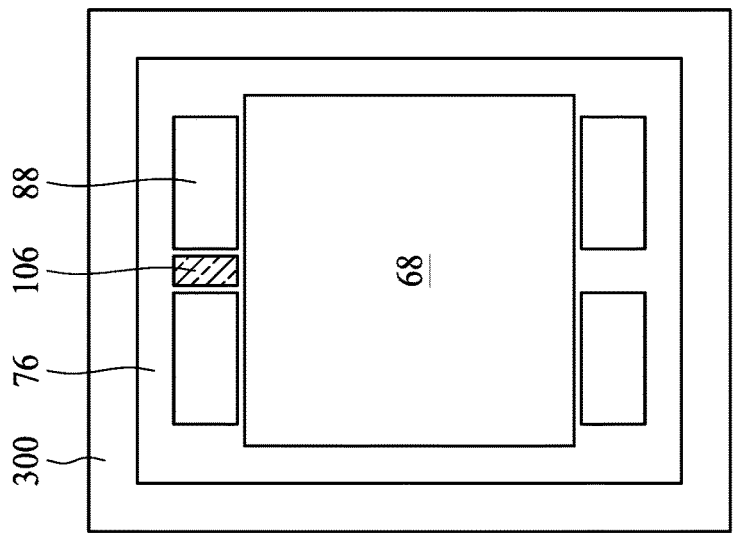

The dummy dies 106 being placed in or near the scribe line regions 94 can help to prevent warpage during and after singulation (see FIG. 13) of the packages in the first and second package regions 90 and 92. For example, the embodiment of FIG. 6C (and singulated package in FIG. 15C discussed later) can reduce the warpage of the package by up to about 60% as compared to a package without any dummy dies 106.

One way the dummy dies 106 can help to reduce warpage is to provide support to the package during the actual singulation process. Another way that the dummy dies 106 can prevent warpage is to reduce the coefficient of thermal expansion (CTE) mismatch between the components 96 and the subsequently formed encapsulant 112 (see FIG. 8) as the dummy dies 106 have a similar CTE to the components 96 and they reduce the amount of encapsulant 112 necessary in the package.

Referring to FIG. 7, dummy dies 106 are adhered in the scribe line regions 94 adjacent the dies 88. The dummy dies 106 are attached to the components 96 with an attaching structure 104. In some embodiments, the attaching structure 104 is an adhesive that adheres the dummy dies 106 to the components 96. In some embodiments, the attaching structure 104 is one or more metal pillars with metal cap layers (sometimes referred to as micro bumps) that bond the dummy dies 106 to the components. The dummy dies 106 may be made of silicon, a dielectric material, the like, or a combination thereof. In some embodiments, the dummy dies 106 are actually defective active dies that have been recycled as dummy dies 106. In some embodiments, the top surfaces of the dummy dies 106 are level with the back sides of the dies 68.

In the adhesive attaching structure 104 embodiments, the adhesive 104 is on bottom surfaces of the dummy dies 106 and adheres the dummy dies 106 to the components 96, such as the redistribution structure 76 in the illustration. The adhesive 104 may be any suitable adhesive, epoxy, die attach film (DAF), or the like. The adhesive 104 may be applied to a bottom surface of the dummy dies 106 or may be applied over the surface of the redistribution structure 76. The dummy dies 106 may be adhered to the redistribution structure 76 by the adhesive 104 using, for example, a pick-and-place tool. The underfill 100 can be cured before or after the dummy dies 106 are adhered.

In the micro bump attaching structure 104 embodiments, the micro bumps 104 are formed on bottom surfaces of the dummy dies 106, the top surfaces of the components 96, or both. The micro bumps 104 can be formed at a same time as micro bumps (e.g. electrical connectors 77/78) that bond the dies 68 and 88. The micro bumps 104 bond the dummy dies 106 to the components 96, such as the redistribution structure 76 in the illustration. The micro bumps 104 of the dummy dies 106 can be reflowed together with the electrical connectors 77/78/7978 of the dies 68 and 88. The dummy dies 106 may be placed on the micro bumps 104 by using, for example, a pick-and-place tool. The underfill 100 can be cured before or after the dummy dies 106 are bonded.

Figure 8:
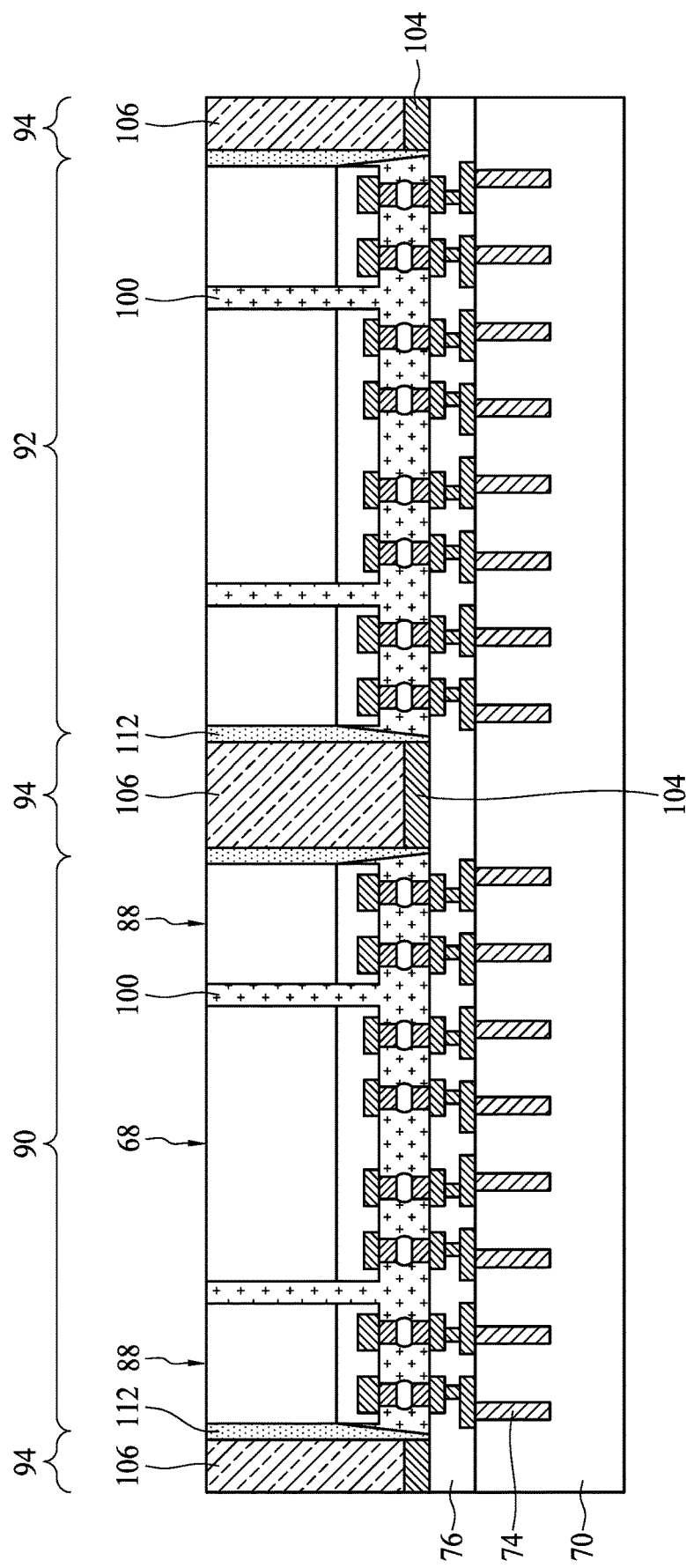

In FIG. 8, an encapsulant 112 is formed on the various components. The encapsulant 112 may be a molding compound, epoxy, or the like, and may be applied by compression molding, transfer molding, or the like. A curing step is performed to cure the encapsulant 112, such as a thermal curing, an Ultra-Violet (UV) curing, or the like. In some embodiments, the dies 68, the dies 88, and the dummy dies 106 are buried in the encapsulant 112, and after the curing of the encapsulant 112, a planarization step, such as a grinding, may be performed to remove excess portions of the encapsulant 112, which excess portions are over top surfaces of dies 68, dies 88, and dummy dies 106. Accordingly, top surfaces of dies 68, dies 88, and dummy dies 106 are exposed, and are level with a top surface of the encapsulant 112. In some embodiments, the dies 88 and/or dummy dies 106 may be different heights from the dies 68 and the dies 88 and/or dies 106 will still be covered by the encapsulant 112 after the planarization step. In some embodiments, the dies 106 have a greater height than both the dies 68 and 88 and the both the dies 68 and 88 are still covered by the encapsulant 112 after the planarization step.

Figure 9:
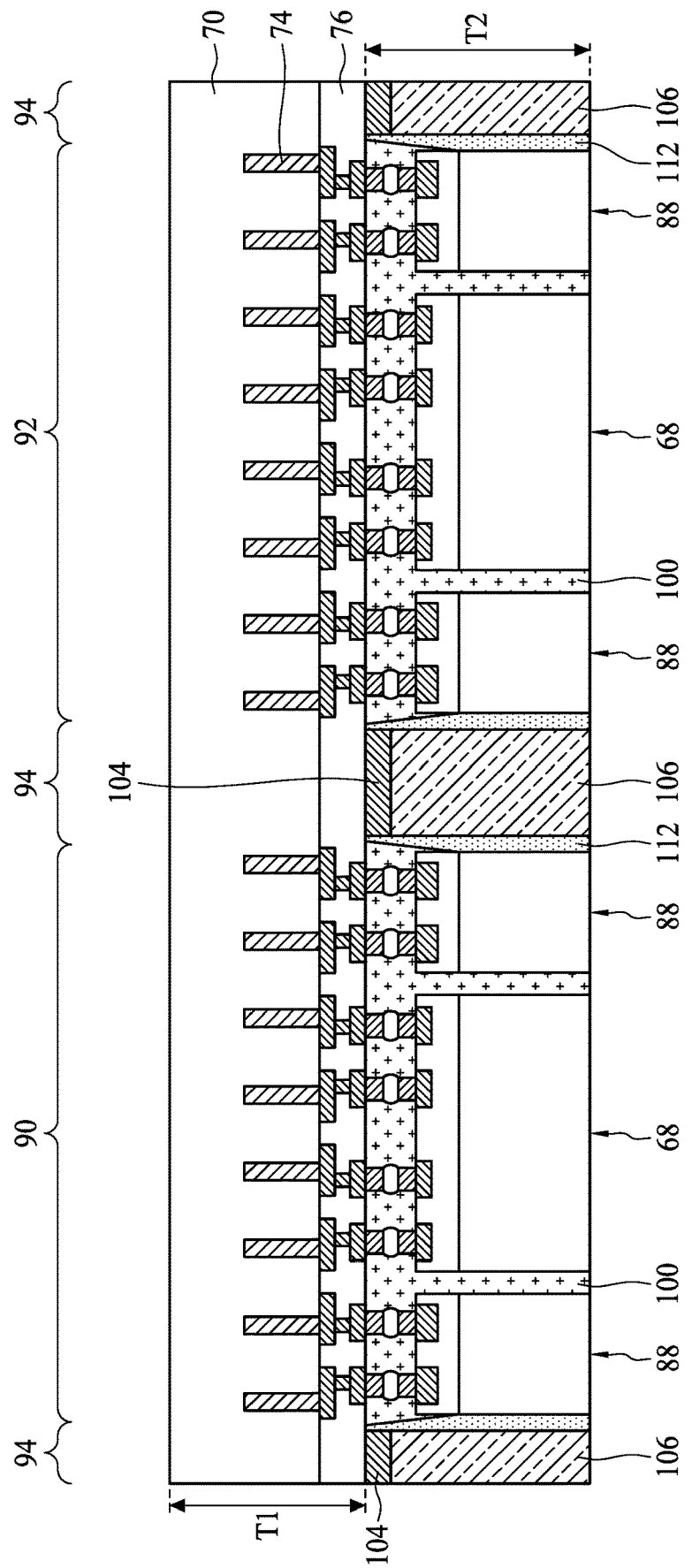

FIGS. 9 through 12 illustrate the formation of the second side of components 96. In FIG. 9, the structure of FIG. 8 is flipped over to prepare for the formation of the second side of components 96. Although not shown, the structure may be placed on carrier or support structure for the process of FIGS. 9 through 12. As shown in FIG. 9, at this stage of processing, the substrate 70 and redistribution structure 76 of the components 96 have a combined thickness T1 in a range from about 50 μm to about 775 μm, such as about 775 μm. The dummy dies 106 (including attaching structure 104) have a thickness T2 in a range from about 30 μm to about 775 μm, such as about 760 μm. In some embodiments, one or both of the dies 68 and 88 (including conductive joints 91) have the thickness T2.

Figure 10:
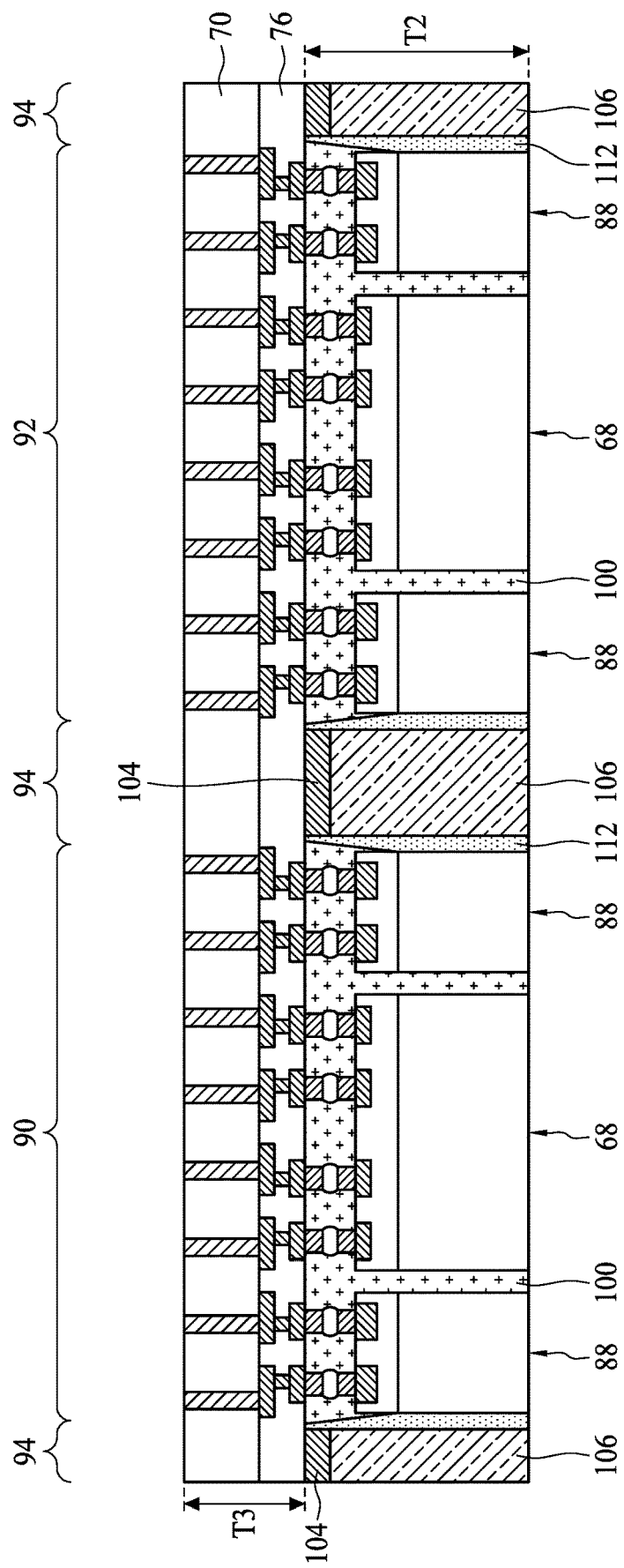

In FIG. 10, a thinning process is performed on the second side of the substrate 70 to thin the substrate 70 to a second surface 116 until TVs 74 are exposed. The thinning process may include an etching process, a grinding process, the like, or a combination thereof. In some embodiments, after the thinning process, the substrate 70 and redistribution structure 76 of the components 96 have a combined thickness T3 in a range from about 30 μm to about 200 μm, such as about 100 μm.

Figure 11:
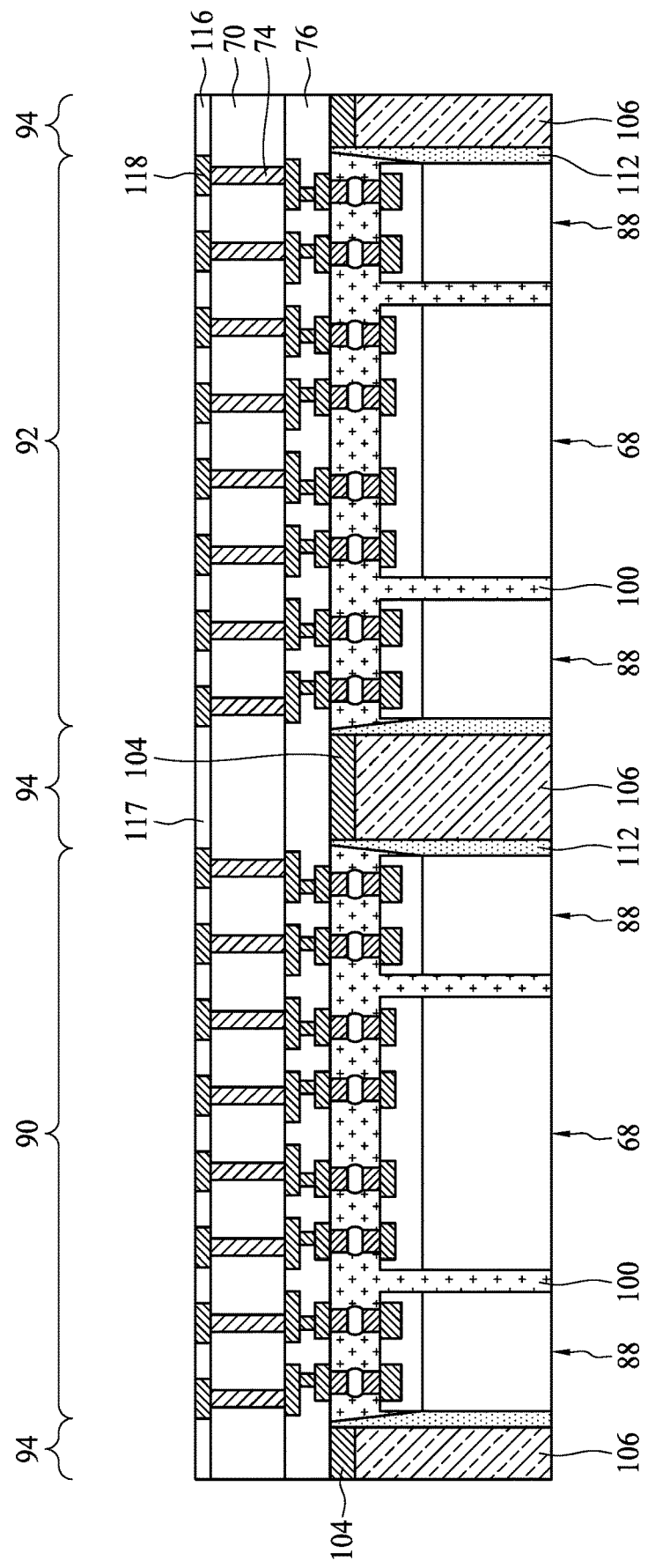

In FIG. 11, a redistribution structure is formed on the second surface 116 of the substrate 70, and is used to electrically connect the TVs 74 together and/or to external devices. The redistribution structure includes one or more dielectric layers 117 and metallization patterns 118 in the one or more dielectric layers 117. The metallization patterns may comprise vias and/or traces to interconnect TVs 74 together and/or to an external device. The metallization patterns 118 are sometimes referred to as Redistribution Lines (RDLs). The dielectric layers 117 may comprise silicon oxide, silicon nitride, silicon carbide, silicon oxynitride, low-K dielectric material, such as PSG, BPSG, FSG, $SiO_xC_y$, Spin-On-Glass, Spin-On-Polymers, silicon carbon material, compounds thereof, composites thereof, combinations thereof, or the like. The dielectric layers 117 may be deposited by any suitable method known in the art, such as spinning, CVD, PECVD, HDP-CVD, or the like. The metallization patterns 118 may be formed in the dielectric layer 117, for example, by using photolithography techniques to deposit and pattern a photoresist material on the dielectric layer 117 to expose portions of the dielectric layer 117 that are to become the metallization pattern 118. An etch process, such as an anisotropic dry etch process, may be used to create recesses and/or openings in the dielectric layer 117 corresponding to the exposed portions of the dielectric layer 117. The recesses and/or openings may be lined with a diffusion barrier layer and filled with a conductive material. The diffusion barrier layer may comprise one or more layers of TaN, Ta, TiN, Ti, CoW, or the like, deposited by ALD, or the like, and the conductive material may comprise copper, aluminum, tungsten, silver, and combinations thereof, or the like, deposited by CVD, PVD, plating, or the like. Any excessive diffusion barrier layer and/or conductive material on the dielectric layer may be removed, such as by using a CMP.

Figure 12:
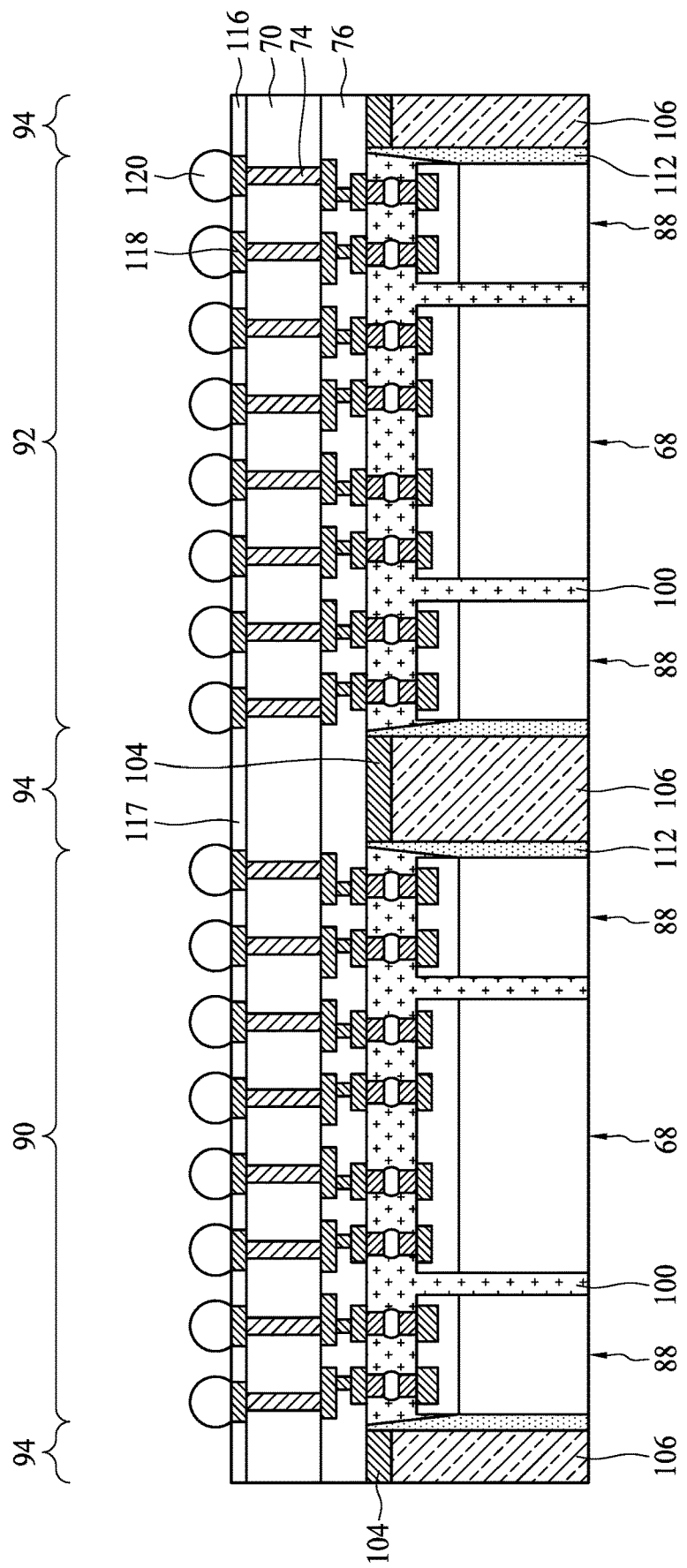

In FIG. 12, electrical connectors 120 are also formed the metallization patterns 118 and are electrically coupled to TVs 74. The electrical connectors 120 are formed at the top surface of the redistribution structure on the metallization patterns 118. In some embodiments, the metallization patterns 118 include UBMs. In the illustrated embodiment, the pads are formed in openings of the dielectric layers 117 of the redistribution structure. In another embodiment, the pads (UBMs) can extend through an opening of a dielectric layer 117 of the redistribution structure and also extend across the top surface of the redistribution structure.

As an example to form the pads, a seed layer (not shown) is formed at least in the opening in one of the dielectric layer 117 of the redistribution structure. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads. In the embodiment, where the pads are formed differently, more photo resist and patterning steps may be utilized.

In some embodiments, the electrical connectors 120 are solder balls and/or bumps, such as ball grid array (BGA) balls, C4 micro bumps, ENIG formed bumps, ENEPIG formed bumps, or the like. The electrical connectors 120 may include a conductive material such as solder, copper, aluminum, gold, nickel, silver, palladium, tin, the like, or a combination thereof. In some embodiments, the electrical connectors 120 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the electrical connectors 120 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 120. The metal cap layer may include nickel, tin, tin-lead, gold, silver, palladium, indium, nickel-palladium-gold, nickel-gold, the like, or a combination thereof and may be formed by a plating process.

Figure 14:
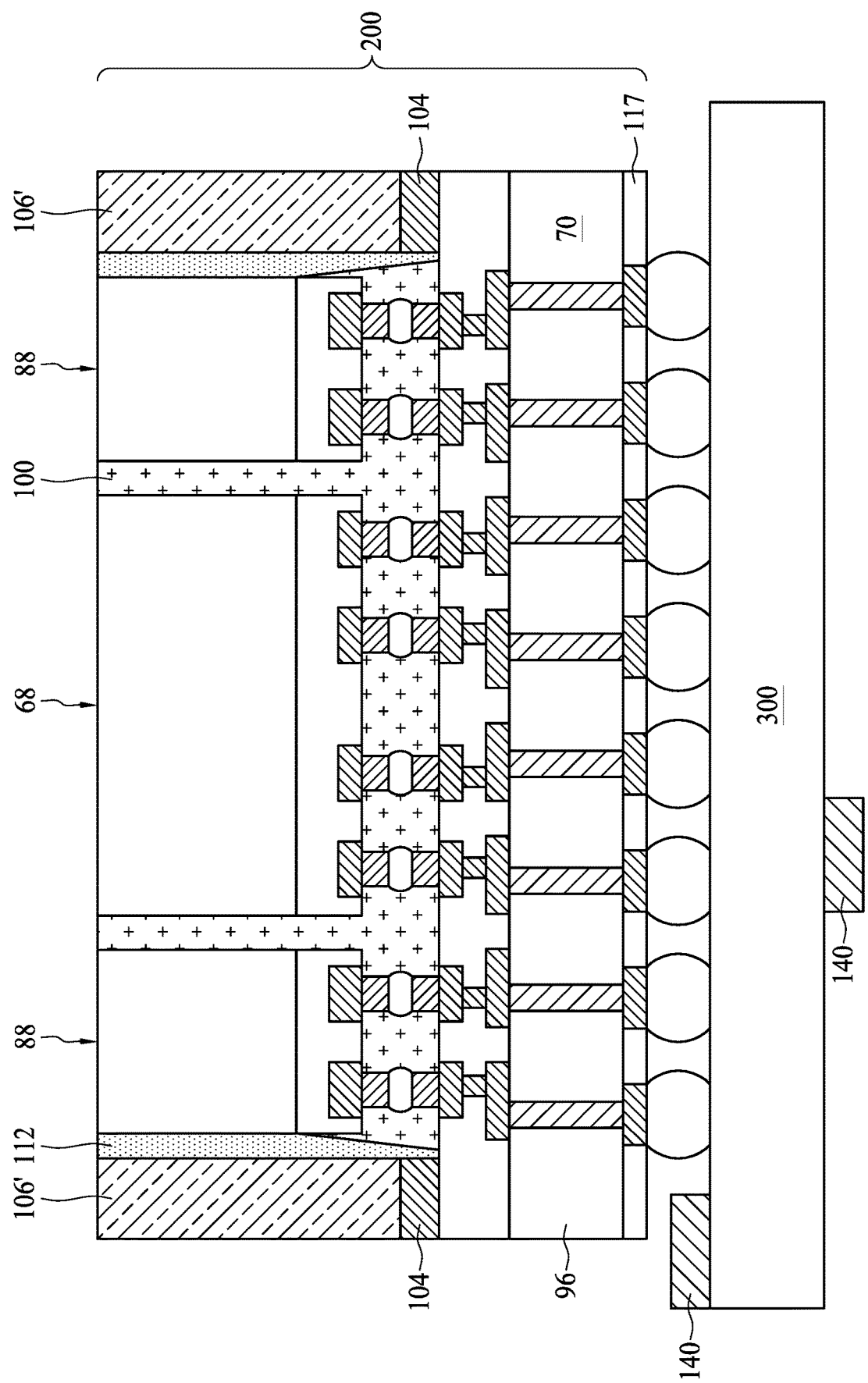

The electrical connectors 120 may be used to bond to an additional electrical component, which may be a semiconductor substrate, a package substrate, a Printed Circuit Board (PCB), or the like (see 300 in FIG. 14).

In FIG. 13, components 96 and dummy dies 106 are singulated between adjacent regions 90 and 92 along scribe line regions 94 to form component packages 200 comprising, among other things, a die 68, a component 96, dies 88, and portions 106' of the dummy dies 106. The singulation may be by sawing, dicing, or the like. As discussed above, the dummy dies 106 help to reduce the stress and warpage caused during and after the singulation process.

After the singulation process, the remaining portions 106' of the dummy dies 106 have sidewall surfaces that are coterminous with the lateral extents of the component package 200 (see, e.g., FIGS. 13 and 14).

FIG. 14 illustrates the attachment of a component package 200 on a substrate 300. Electrical connectors 120 are aligned to, and are put against, bond pads of the substrate 300. The electrical connectors 120 may be reflowed to create a bond between the substrate 300 and the component 96. The substrate 300 may comprise a package substrate, such as a build-up substrate including a core therein, a laminate substrate including a plurality of laminated dielectric films, a PCB, or the like. The substrate 300 may comprise electrical connectors (not shown), such as solder balls, opposite the component package to allow the substrate 300 to be mounted to another device. An underfill material (not shown) can be dispensed between the component package 200 and the substrate 300 and surrounding the electrical connectors 120. The underfill material may be any acceptable material, such as a polymer, epoxy, molding underfill, or the like.

Additionally, one or more surface devices 140 may be connected to the substrate 300. The surface devices 140 may be used to provide additional functionality or programming to the component package 200, or the package as a whole. In an embodiment, the surface devices 140 may include surface mount devices (SMDs) or integrated passive devices (IPDs) that include passive devices such as resistors, inductors, capacitors, jumpers, combinations of these, or the like that are desired to be connected to and utilized in conjunction with component package 200, or other parts of the package. The surface devices 140 may be placed on a first major surface of the substrate 300, an opposing major surface of the substrate 300, or both, according to various embodiments.

FIGS. 15A, 15B, 15C, 15D, 15E, and 15F illustrate plan views of the singulated package structures in each of the dummy die 106 embodiments shown in FIGS. 6A, 6B, 6C, 6D, 6E, and 6F, respectively. These embodiments are symmetrical with the dies 68 having dies 88 and dummy dies 106 on opposite sides of the dies 68.

Figure 17A:
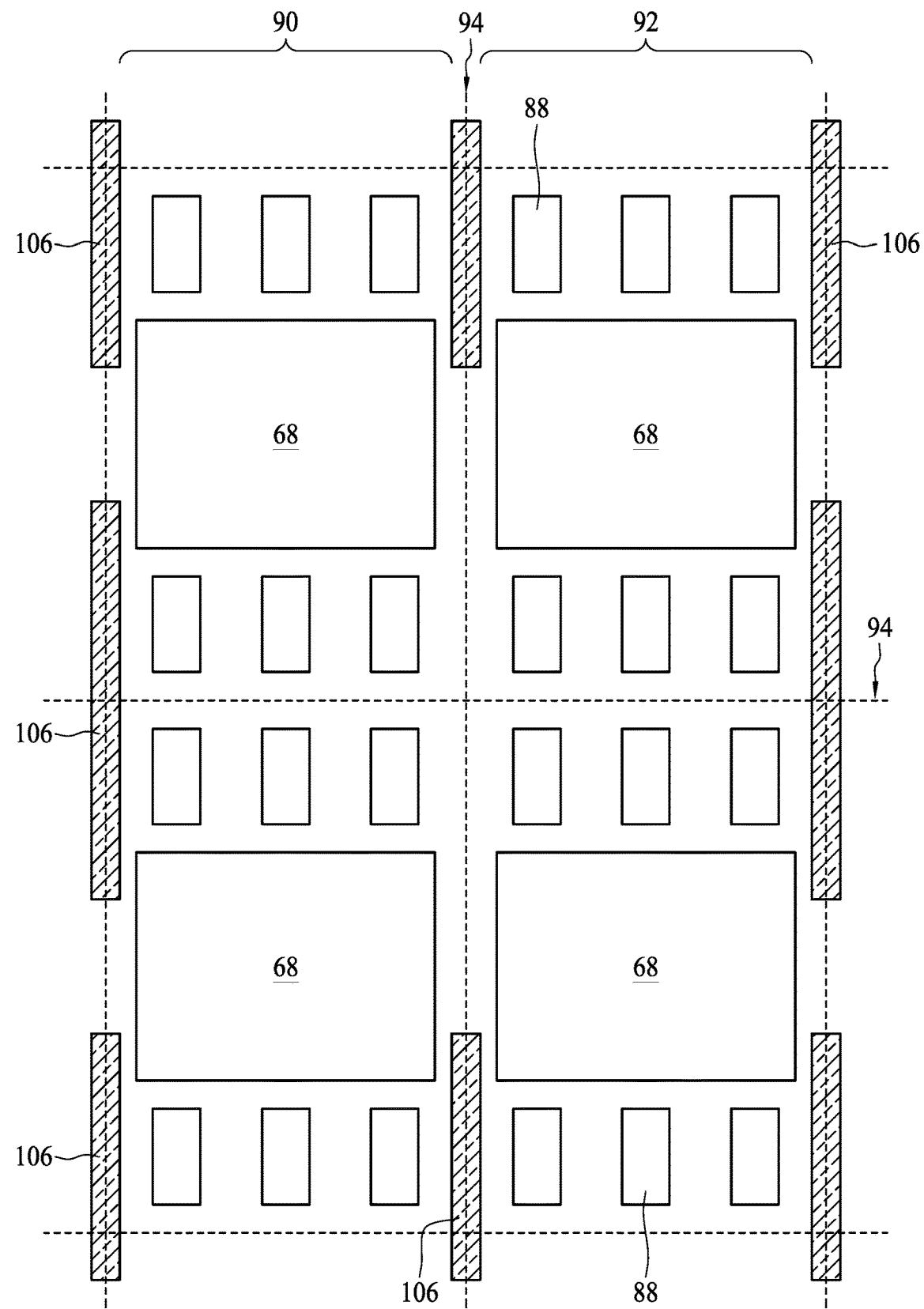
FIGS. 17A-17D illustrate plan views of a package structures in accordance with some embodiments.
Figure 17B:
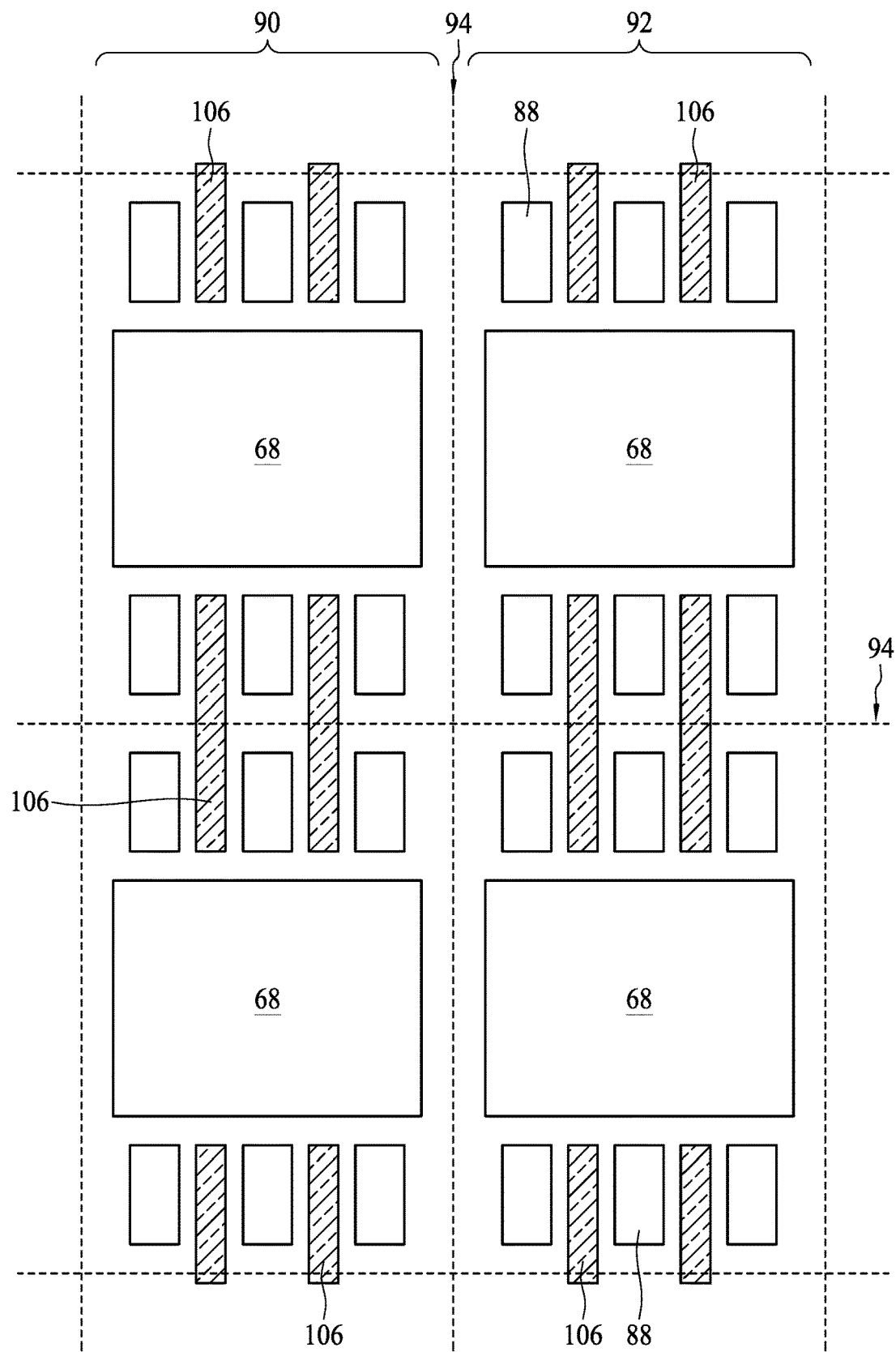
Figure 17C:
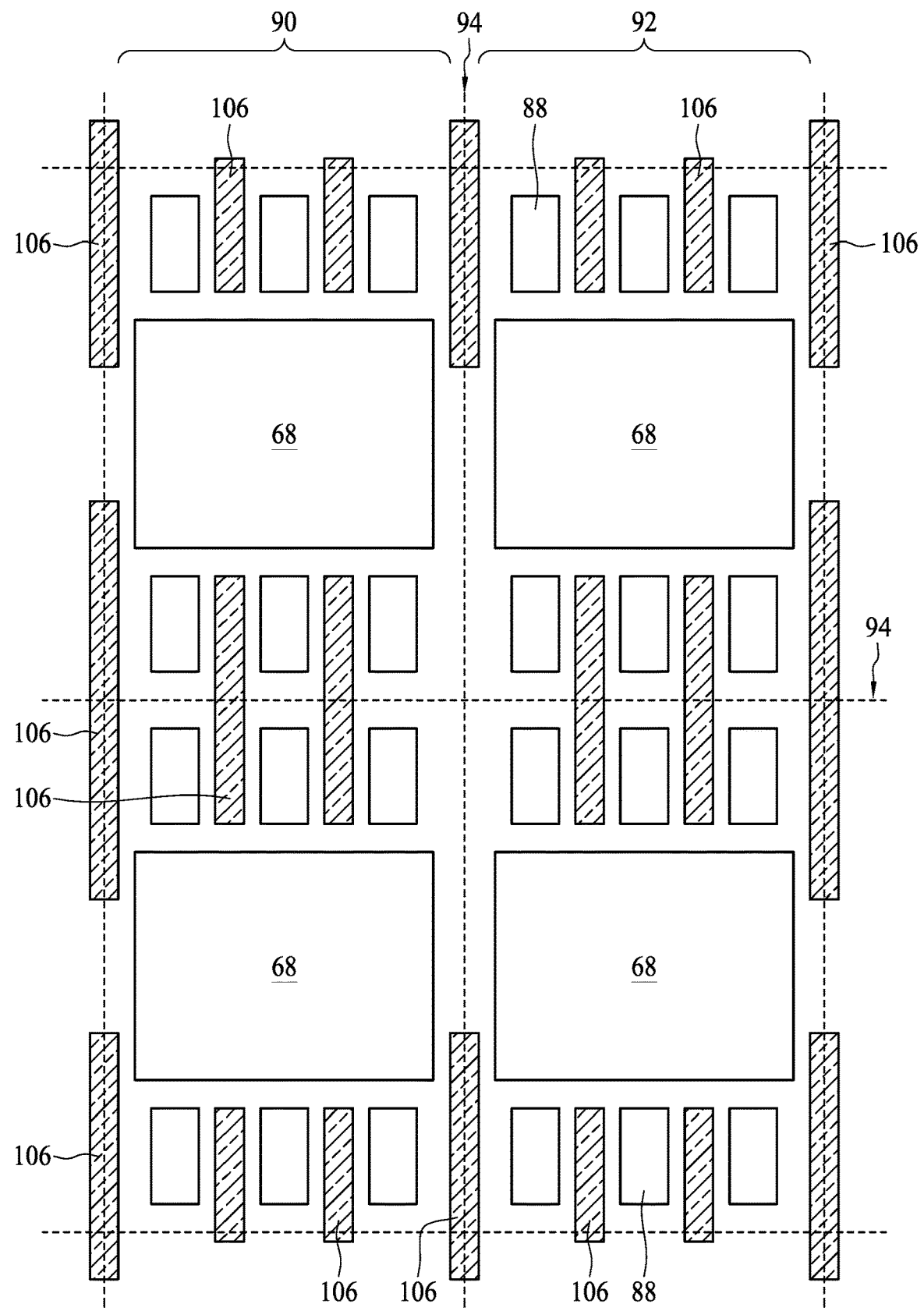

FIGS. 16A, 16B, 16C, 16D, 16E, and 16F illustrate plan views of a singulated package structure in other embodiments in each of the dummy die 106 embodiments shown in FIGS. 6A, 6B, 6C, 6D, 6E, and 6F, respectively. In these embodiments, the singulated package structures are asymmetric as the dies 88 and the dummy dies 106 are only on one side (e.g. top side of plan view in FIGS. 16A, 16B, 16C, 16D, 16E, and 16F) of the die 68. These package structures can be manufactured using similar materials, structures, and processes as those described above in FIGS. 1 through 5 and 7 through 14, and the description is not repeated herein FIGS. 17A, 17B, and 17C illustrate plan views at a similar point of processing and similar in dummy die 106 configurations as FIGS. 6A, 6B, and 6C, respectively, except that in these embodiments, there are more dies 88 in each of the package structures. These package structures can be manufactured using similar materials, structures, and processes as those described above in FIGS. 1 through 5 and 7 through 14, and the description is not repeated herein.

Figure 17D:
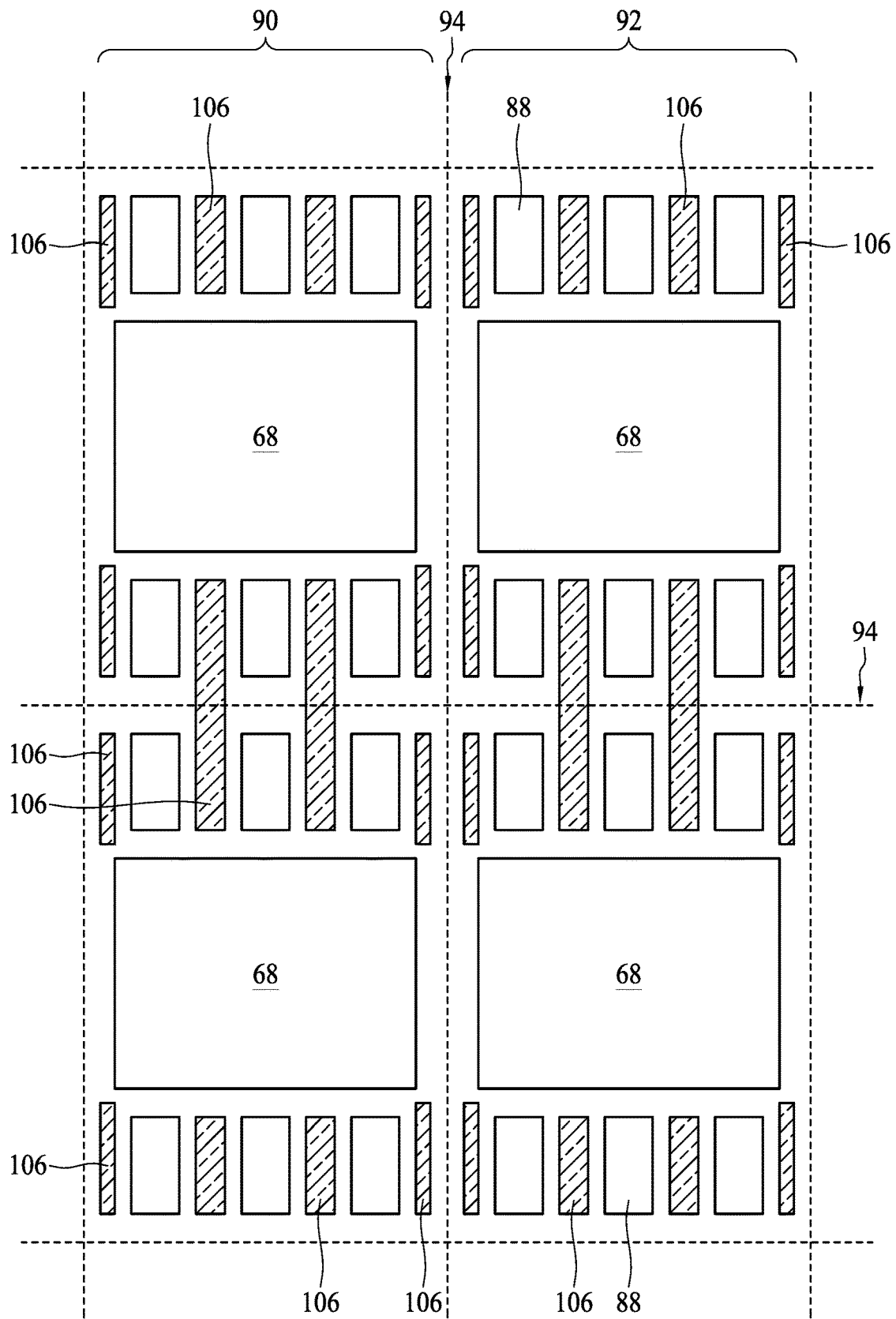

FIG. 17D illustrates a plan view of another embodiment of a dummy die 106 configuration similar to those in FIGS. 17A-17C, except that in this embodiment, the dummy dies 106 are within the regions 90 and 92 and are not in the scribe line regions 94. These package structures can be manufactured using similar materials, structures, and processes as those described above in FIGS. 1 through 5 and 7 through 14, and the description is not repeated herein. This type of configuration (e.g. no dummy dies 106 in the scribe line regions 94) can also be applied to any of the prior configurations described above.

The disclosed embodiments of a package structure including dummy die structures adjacent the active dies can help to reduce the warpage of the package structure. This reduction of the warpage of the package structure enables a more reliable package structure by reducing the likelihood of cold joints between the active dies and the interposer. For example, the disclosed embodiments can reduce the warpage of the package by about 60% as compared to a package without any dummy dies. In some embodiments, the dummy dies are in or near the scribe line regions to help to prevent warpage during and after singulation of the. One way the dummy dies can help to reduce warpage is to provide support to the package during the actual singulation process. Another way that the dummy dies can prevent warpage is to reduce the CTE mismatch between the interposer and the encapsulant as the dummy dies have a similar CTE to the interposer and the dummy dies reduce the amount of encapsulant necessary in the package.

In an embodiment, a method includes: bonding a first die to a first side of an interposer using first electrical connectors; bonding a second die to first side of the interposer using second electrical connectors; attaching a first dummy die to the first side of the interposer adjacent the second die; encapsulating the first die, the second die, and the first dummy die with an encapsulant; and singulating the interposer and the first dummy die to form a package structure.

Embodiments may include one or more of the following features. The method where the interposer is a third die. The method where the interposer is a bulk substrate including a redistribution structure, the first die and second dies being bonded to the redistribution structure. The method where singulating includes sawing through the interposer and the first dummy die to form the package structure. The method where the first die includes one or more logic dies, and where the second die includes one or more memory dies. The method further including: forming an underfill between the interposer and the first die and the second die and surrounding the first electrical connectors and the second electrical connectors, the encapsulant being formed over the underfill. The method further including: forming through vias extending through the interposer, the first and second dies being electrically coupled to the through vias; forming third electrical connectors on a second side of the interposer, the second side being opposite the first side, the third electrical connectors being electrically coupled to the through vias; mounting the package structure to a substrate using the third electrical connectors; and bonding a surface mount device (SMD) to the substrate. The method where the first dummy die. The method where attaching the first dummy die to the first side of the interposer includes: adhering the first dummy die to the first side of the interposer with an adhesive layer. The method where attaching the first dummy die to the first side of the interposer includes: bonding the first dummy die to the first side of the interposer with fourth electrical connectors.

In an embodiment, a method includes: forming through vias in a substrate; forming a first redistribution structure on a first side of the substrate, the first redistribution structure being electrically coupled to the through vias; bonding a logic die to the first redistribution structure using first electrical connectors, the first electrical connectors being electrically coupled to the first redistribution structure; bonding a stack of memory dies to the first redistribution structure using second electrical connectors, the stack of memory dies being adjacent the logic die, the second electrical connectors being electrically coupled to the first redistribution structure; attaching a dummy die over the first redistribution structure in scribe line regions adjacent the stack of memory dies; and singulating the substrate, the first redistribution structure, and the dummy die to form a package structure.

Embodiments may include one or more of the following features. The method where singulating includes sawing through the substrate, the first redistribution structure, and dummy die in the scribe line regions to form the package structure. The method further including: forming an underfill between the first redistribution structure and the logic die and the stack of memory dies and surrounding the first electrical connectors and the second electrical connectors; and encapsulating the logic die, the stack of memory dies, and the dummy die with an encapsulant, the encapsulant adjoining portions of the underfill. The method where the dummy die is made of silicon. The method where attaching the dummy die over the first redistribution structure includes: adhering the dummy die to the first redistribution structure with an adhesive layer. The method where attaching the dummy die over the first redistribution structure includes: bonding the dummy die to the first redistribution structure with third electrical connectors. The method further including: thinning a second side of the substrate to expose ends of the through vias, the second side being opposite the first side; forming a second redistribution structure on the second side of the substrate, the second redistribution structure being electrically coupled to the exposed ends of the through vias; forming fourth electrical connectors on and electrically coupled to the second redistribution structure; bonding the fourth electrical connectors to a second substrate; and bonding a surface mount device (SMD) to the second substrate adjacent one of the fourth electrical connectors.

In an embodiment, a structure includes: a first side of an interposer bonded to a substrate; a logic die and a memory stack bonded to a second side of the interposer, the second side being opposite the first side; a dummy die attached to the second side of the interposer, the dummy die being adjacent to the logic die or the memory stack; and a molding material extending along sidewalls of the logic die, the memory stack, and the dummy die, a top surfaces of the logic die and the dummy die being exposed through the molding material.

Embodiments may include one or more of the following features. The structure where the dummy die has sidewall surface that is coterminous with lateral extents of the interposer. The structure where the dummy die is made of silicon.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   bonding a first die to a first side of an interposer using first electrical connectors;
   bonding a second die to first side of the interposer using second electrical connectors, the second die being adjacent the first die;
   bonding a third die to the first side of the interposer using third electrical connectors, the third die being adjacent the first die;
   forming an underfill between the interposer and the first die and the second die and surrounding the first electrical connectors and the second electrical connectors;
   after forming the underfill, attaching a first dummy die to the first side of the interposer adjacent the second die;
   after forming the underfill, attaching a second dummy die to the first side of the interposer adjacent the third die, the second dummy die being a distinct dummy die that is physically separated from the first dummy die, wherein each of the second dummy die, the second die, and the third die are disposed between the first dummy die and the first die;
   encapsulating the first die, the second die, and the first dummy die with an encapsulant; and
   singulating the interposer, the first dummy die, and the second dummy die to form a package structure, wherein the package structure includes a portion of the first dummy die and an entirety of the second dummy die.

2. The method of claim 1, wherein the interposer is a fourth die.

3. The method of claim 1, wherein the interposer is a bulk substrate including a redistribution structure, the first and second dies being bonded to the redistribution structure.

4. The method of claim 1, wherein singulating comprises sawing through the interposer and the first dummy die to form the package structure, and does not comprise sawing through the second dummy die to form the package structure.

5. The method of claim 1, wherein the first die comprises one or more logic dies, and wherein the second die comprises one or more memory dies.

6. The method of claim 1, wherein the encapsulant is formed over the underfill, the encapsulant contacting a sidewall of the underfill.

7. The method of claim 1 further comprising:
   forming through vias extending through the interposer, the first and second dies being electrically coupled to the through vias;
   forming third electrical connectors on a second side of the interposer, the second side being opposite the first side, the third electrical connectors being electrically coupled to the through vias;
   mounting the package structure to a substrate using the third electrical connectors; and
   bonding a surface mount device (SMD) to the substrate.

8. The method of claim 1, wherein attaching the first dummy die to the first side of the interposer comprises:
   adhering the first dummy die to the first side of the interposer with an adhesive layer.

9. The method of claim 1, wherein attaching the first dummy die to the first side of the interposer comprises:
   bonding the first dummy die to the first side of the interposer with fourth electrical connectors.

10. The method of claim 1, wherein the first dummy die is larger than the second dummy die.

11. A method comprising:
    forming through vias in a substrate;
    forming a first redistribution structure on a first side of the substrate, the first redistribution structure being electrically coupled to the through vias;
    bonding a logic die to the first redistribution structure using first electrical connectors, the first electrical connectors being electrically coupled to the first redistribution structure;
    bonding a stack of memory dies to the first redistribution structure using second electrical connectors, the stack of memory dies being adjacent the logic die, the second electrical connectors being electrically coupled to the first redistribution structure;
    forming an underfill between the first redistribution structure and the logic die and the stack of memory dies and surrounding the first electrical connectors and the second electrical connectors;
    after forming the underfill, attaching a first dummy die over the first redistribution structure in scribe line regions and adjacent the stack of memory dies;
    after forming the underfill, attaching a second dummy die over the first redistribution structure outside the scribe line regions, the second dummy die and the stack of memory dies being disposed between the first dummy die and the logic die; and
    singulating the substrate, the first redistribution structure, and the first dummy die to form a package structure.

12. The method of claim 11, wherein singulating comprises sawing through the substrate, the first redistribution structure, and the first dummy die in the scribe line regions to form the package structure.

13. The method of claim 11 further comprising:
    encapsulating the logic die, the stack of memory dies, and the first dummy die with an encapsulant, the encapsulant adjoining portions of the underfill.

14. The method of claim 11, wherein the first and second dummy dies are made of silicon.

15. The method of claim 11, wherein attaching the first dummy die over the first redistribution structure comprises:
    adhering the first dummy die to the first redistribution structure with an adhesive layer.

16. The method of claim 11, wherein attaching the first dummy die over the first redistribution structure comprises:
    bonding the first dummy die to the first redistribution structure with third electrical connectors.

17. The method of claim 11 further comprising:
    thinning a second side of the substrate to expose ends of the through vias, the second side being opposite the first side;
    forming a second redistribution structure on the second side of the substrate, the second redistribution structure being electrically coupled to the exposed ends of the through vias;
    forming fourth electrical connectors on and electrically coupled to the second redistribution structure;
    bonding the fourth electrical connectors to a second substrate; and
    bonding a surface mount device (SMD) to the second substrate adjacent one of the fourth electrical connectors.

18. A method comprising:
    forming a first redistribution structure on a first side of a substrate, the substrate comprising through vias, the first redistribution structure being electrically coupled to the through vias;

bonding a logic die to the first redistribution structure using first electrical connectors, the first electrical connectors being electrically coupled to the first redistribution structure;

bonding a first memory die and a second memory die to the first redistribution structure using second electrical connectors, the first and second memory dies being adjacent the logic die, the second electrical connectors being electrically coupled to the first redistribution structure;

forming an underfill between the first redistribution structure and the logic die and the first and second memory dies and surrounding the first electrical connectors and the second electrical connectors;

after forming the underfill, attaching a first dummy die and a second dummy die over the first redistribution structure, the first dummy die being in scribe line regions adjacent the first and second memory dies, the second dummy die being between the first and second memory dies and outside the scribe line region;

encapsulating the logic die, the first and second memory dies, and the first and second dummy dies with an encapsulant, the encapsulant adjoining portions of the underfill; and singulating the substrate, the first redistribution structure, and the first dummy die to form a package structure.

19. The method of claim 18 further comprising:

thinning a second side of the substrate to expose ends of the through vias, the second side being opposite the first side;

forming a second redistribution structure on the second side of the substrate, the second redistribution structure being electrically coupled to the exposed ends of the through vias;

forming third electrical connectors on and electrically coupled to the second redistribution structure;

bonding the third electrical connectors to a second substrate; and bonding a surface mount device (SMD) to the second substrate adjacent one of the third electrical connectors.

20. The method of claim 18, wherein attaching the first dummy die and the second dummy die over the first redistribution structure comprises:

bonding the first dummy die and the second dummy die to the first redistribution structure with third electrical connectors.

* * * * *